(12) United States Patent
Lee et al.

(10) Patent No.: US 9,741,962 B2
(45) Date of Patent: Aug. 22, 2017

(54) ORGANIC LIGHT EMITTING DIODE DISPLAY AND MANUFACTURING METHOD THEREOF

(71) Applicant: Samsung Display Co., Ltd., Yongin-si (KR)

(72) Inventors: Sung Eun Lee, Yongin-si (KR); Seung-Hwan Cho, Yongin-si (KR); Dong Hwan Shim, Yongin-si (KR); Joo Sun Yoon, Yongin-si (KR); Jung Kyu Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/969,321

(22) Filed: Dec. 15, 2015

(65) Prior Publication Data

US 2016/0343980 A1 Nov. 24, 2016

(30) Foreign Application Priority Data

May 22, 2015 (KR) ........................ 10-2015-0072177

(51) Int. Cl.
*H01L 29/08* (2006.01)
*H01L 51/52* (2006.01)
*H01L 27/32* (2006.01)

(52) U.S. Cl.
CPC ...... *H01L 51/5246* (2013.01); *H01L 27/3258* (2013.01); *H01L 27/3276* (2013.01)

(58) Field of Classification Search
CPC ............. H01L 27/3258; H01L 27/3276; H01L 51/5246

USPC ....... 257/40, 72, 59; 438/158; 345/211, 204; 428/426; 315/169.3
See application file for complete search history.

(56) References Cited

U.S. PATENT DOCUMENTS

| 8,740,095 B2 | 6/2014 | Dichtl | |
| 8,860,706 B2 * | 10/2014 | Sakamoto | G11C 19/184 345/204 |
| 9,001,091 B2 * | 4/2015 | Sakamoto | G09G 3/3688 345/204 |
| 2005/0285542 A1 * | 12/2005 | Wakabayashi | H01L 27/3276 315/169.3 |

(Continued)

FOREIGN PATENT DOCUMENTS

| KR | 10-2006-0028519 | 3/2006 |
| KR | 10-2006-0084147 | 7/2006 |
| KR | 10-2014-0115037 | 9/2014 |

*Primary Examiner* — Mohammed Shamsuzzaman
(74) *Attorney, Agent, or Firm* — Knobbe Martens Olson & Bear LLP

(57) ABSTRACT

An organic light emitting diode display includes: a substrate including a display area displaying an image and a peripheral area enclosing the display area; a plurality of signal lines formed in the display area; a plurality of pixels connected to the plurality of signal lines; a plurality of fan-out lines formed in the peripheral area and connected to the plurality of pixels; a first interlayer insulating layer covering the plurality of fan-out lines; a second interlayer insulating layer covering the first interlayer insulating layer and including a first sealant opening exposing a portion of the first interlayer insulating layer; and an etching preventing member positioned in the first sealant opening and overlapping the plurality of fan-out lines in plan view.

12 Claims, 25 Drawing Sheets

(56) References Cited

U.S. PATENT DOCUMENTS

| | | | |
|---|---|---|---|
| 2006/0097262 A1* | 5/2006 | Kim | G02F 1/136213 257/72 |
| 2008/0067511 A1* | 3/2008 | Kim | G02F 1/136204 257/59 |
| 2013/0033465 A1* | 2/2013 | Kang | H01L 51/5259 345/204 |
| 2014/0065430 A1* | 3/2014 | Yamazaki | H01L 27/1214 428/426 |
| 2014/0134809 A1* | 5/2014 | Bai | H01L 27/1288 438/158 |
| 2014/0284574 A1* | 9/2014 | Hong | G02F 1/13452 257/40 |

* cited by examiner

ORGANIC LIGHT EMITTING DIODE DISPLAY AND MANUFACTURING METHOD THEREOF

CROSS-REFERENCE TO RELATED APPLICATION

This application claims priority to, and the benefit of, Korean Patent Application No. 10-2015-0072177 filed in the Korean Intellectual Property Office on May 22, 2015, the entire contents of which are incorporated herein by reference.

BACKGROUND

Field

The present disclosure relates to an organic light emitting diode display and a manufacturing method thereof.

Description of the Related Technology

An organic light emitting diode display includes two electrodes and an organic light emitting layer positioned therebetween. Electrons injected from a cathode that is an electrode and holes injected from an anode that is another electrode are bonded to each other in the organic light emitting layer to form excitons. Light is emitted while the excitons discharge energy.

The organic light emitting diode display includes a display substrate formed of pixels including an organic light emitting diode made of the cathode, the anode, and the organic emission layer, an encapsulation member arranged opposite to the display substrate and protecting the organic light emitting diode of the display substrate, and a sealant assembling and sealing the display substrate and the encapsulation member. In general, the sealant is formed on the organic layer of the display substrate, however adherence between the organic layer and the sealant is low such that the sealant may be easily separated from the organic layer. Accordingly, to prevent the separation of the sealant, an organic layer is typically removed at the position where the sealant is formed. Accordingly, the inorganic layer is exposed under the organic layer at the position where the sealant is formed. However, when etching the data metal layer, the exposed inorganic layer is removed such that the gate metal layer under the inorganic layer may be easily exposed. Accordingly, the gate metal layer exposed when etching the anode may be damaged. When the gate metal layer is a fan-out line connecting the organic light emitting diode and a driving circuit chip, a product failure may be easily generated due to the damage of the fan-out line overlapping the sealant.

The above information disclosed in this Background section is only for enhancement of understanding of the background of the disclosure and therefore it may contain information that does not form the prior art that is already known in this country to a person of ordinary skill in the art.

SUMMARY OF CERTAIN INVENTIVE ASPECTS

The present disclosure provides an organic light emitting diode display preventing damage to a fan-out line overlapping a sealant, and a manufacturing method thereof.

An organic light emitting diode display according to an embodiment includes: a substrate including a display area displaying an image and a peripheral area enclosing the display area; a plurality of signal lines formed in the display area; a plurality of pixels connected to the plurality of signal lines; a plurality of fan-out lines formed in the peripheral area and connected to the plurality of pixels; a first interlayer insulating layer covering the plurality of fan-out lines; a second interlayer insulating layer covering the first interlayer insulating layer and including a first sealant opening exposing a portion of the first interlayer insulating layer; and an etching preventing member positioned in the first sealant opening and overlapping the plurality of fan-out lines in plan view.

A passivation layer formed on the second interlayer insulating layer and including a second sealant opening having the same pattern as the first sealant opening, and a sealant in the peripheral area and crossing the plurality of fan-out lines may be further included, and the sealant may fill the first sealant opening and the second sealant opening.

Each of the signal lines may include a scan line formed on the substrate and transmitting a scan signal, and a data line and a driving voltage line crossing the scan line and respectively transmitting a data voltage and a driving voltage, and each of the pixels may include a switching transistor connected to the scan line and the data line, a driving transistor connected to the switching transistor and including a driving gate electrode, a second storage electrode overlapping a first storage electrode of the driving gate electrode and extended from the driving voltage line, and an organic light emitting diode electrically connected to the driving transistor.

Each of the fan-out lines may be formed on the same layer as the scan line, and the etching preventing member may be formed on the same layer as the data line.

The first interlayer insulating layer may cover the scan line, and the data line may be formed on the second interlayer insulating layer.

The sealant may be positioned on the etching preventing member.

The driving voltage line may include a first driving voltage line parallel to the data line and a second driving voltage line parallel to the data line, and the first driving voltage line may be formed on the same layer as the data line, while the second driving voltage line may be formed on the same layer as the scan line.

The second storage electrode may be formed on the first interlayer insulating layer, and the first driving voltage line and the data line may be formed on the second interlayer insulating layer.

The first interlayer insulating layer may include an inorganic material, and the second interlayer insulating layer and the passivation layer may include an organic material.

The etching preventing member may overlap each of the plurality of fan-out lines.

The etching preventing member may overlap the plurality of fan-out lines.

A semiconductor formed on the substrate and including a switching channel of the switching transistor and a driving channel of the driving transistor separated from each other may be further included, and the driving channel may overlap the driving gate electrode and the driving channel is curved in plan view.

A manufacturing method of an organic light emitting diode display according to an embodiment may include: forming a semiconductor on a substrate including a display area displaying an image and a peripheral area enclosing the display area; forming a gate insulating layer covering the semiconductor; forming a scan line on the gate insulating layer of the display area and a fan-out line on the gate insulating layer of the peripheral area; forming a first interlayer insulating layer covering the scan line and the fan-out line; forming a second interlayer insulating layer on the first interlayer insulating layer; simultaneously etching the gate insulating layer, the first interlayer insulating layer, and the second interlayer insulating layer by using a half tone mask to form a contact hole exposing the semiconductor and a first sealant opening exposing the first interlayer insulating layer; and forming a data line on the second interlayer insulating layer and an etching preventing member in the first sealant opening, The first sealant opening may be formed to cross the plurality of fan-out lines in plan view.

The etching preventing member may be formed to overlap the plurality of fan-out lines in plan view.

The method may further include: forming a passivation layer on the data line and the second interlayer insulating layer; forming a second sealant opening of the same pattern as the first sealant opening in the passivation layer; and filling a sealant in the first sealant opening and the second sealant opening.

The first interlayer insulating layer may include an inorganic material, and the second interlayer insulating layer may include an organic material.

According to the present disclosure, by forming the etching preventing member covering the fan-out line, damage to the first interlayer insulating layer by the etchant inflowed through the sealant opening in the etching process of the data metal line may be prevented.

Further, since the first interlayer insulating layer exposed by the sealant opening is not damaged, the etchant inflowed through the sealant opening in the etching process of the pixel electrode is prevented from being inflowed into the fan-out line positioned under the first interlayer insulating layer, thereby preventing the damage of the fan-out line.

DETAILED DESCRIPTION OF CERTAIN INVENTIVE EMBODIMENTS

Figure 1:
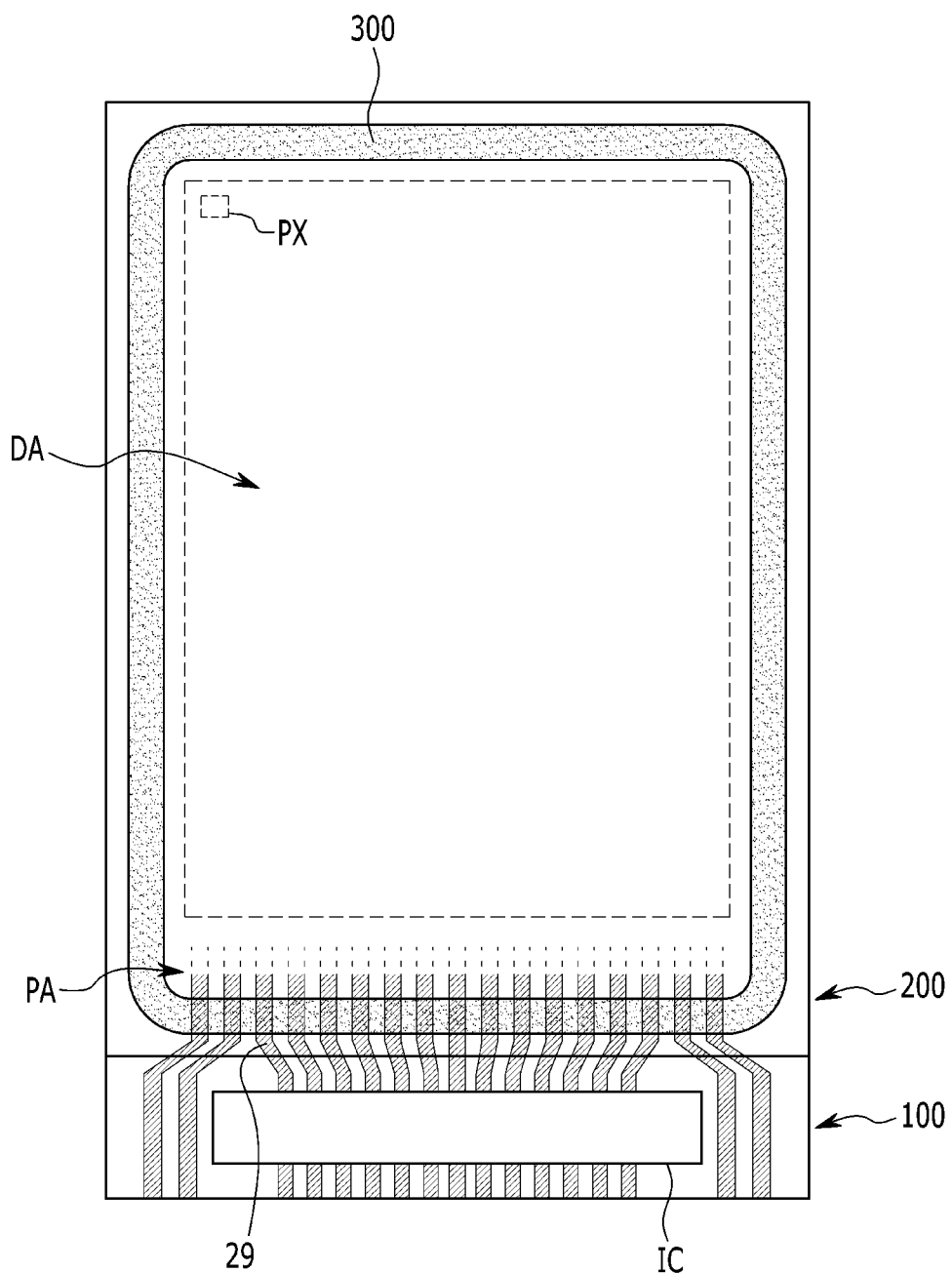
FIG. 1 is an overall top plan view of an organic light emitting diode display according to an embodiment.

The present disclosure will be described more fully hereinafter with reference to the accompanying drawings, in which certain embodiments of the disclosure are shown. As those skilled in the art would realize, the described embodiments may be modified in various ways, without departing from the spirit or scope of the present disclosure.

Throughout the specification, for the purpose of clarity, parts that are not relevant to the detailed description of the present disclosure may be omitted, and the same reference numerals are generally used for like or equivalent constituent elements.

In the drawings, size and thickness of each element are approximately shown for better understanding and ease of description. Therefore, the present disclosure is not limited to the drawings. In the drawings, the thickness of layers, films, panels, regions, etc., may be exaggerated for clarity. In the drawings, the thicknesses of some layers and areas may be exaggerated for convenience of explanation.

Throughout the specification, unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be "directly on" the other element or intervening elements may also be present throughout the specification. In addition, the word "on" means positioning on or below an object portion, but does not essentially mean positioning on the upper side of the object portion based on a gravity direction.

Further, throughout the specification, the phrase "on a plane" means viewing an object portion from the top, and the phrase "on a cross-section" means viewing a section of an object portion which is vertically taken from a side.

Further, the number of transistors and capacitors is not limited to the number illustrated in the accompanying drawings, and an organic light emitting diode display may be formed in various structures in which one pixel may include a plurality of transistors and at least one capacitor and is further provided with separate wiring or may not include the existing wires. A pixel represents a minimum unit which displays an image, and the organic light emitting device displays an image through a plurality of pixels.

Hereinafter, an organic light emitting diode display according to an embodiment will be described with reference to the accompanying drawings.

FIG. 1 is an overall top plan view of an organic light emitting diode display according to an embodiment.

As shown in FIG. 1, an organic light emitting diode display according to an embodiment includes a display substrate 110, an encapsulation member 200 covering the display substrate 110, and a sealant 300 disposed between the display substrate 110 and the encapsulation member 200.

The sealant 300 is formed along an edge of the encapsulation member 200, and the sealant 300 combines and seals the display substrate 110 and the encapsulation member 200 to each other. The encapsulation member 200 is formed smaller than the display substrate 110. A driving circuit chip (IC) is mounted at one edge of the display substrate 110 that is not covered by the encapsulation member 200.

The display substrate 110 includes a display area DA formed with a plurality of pixels PX displaying an image, and a peripheral area PA enclosing a display area. The driving circuit (IC) and fan-out lines 29 electrically connecting the pixels PX and the driving circuit chip IC are formed in the peripheral area PA. The fan-out lines 29 cross the sealant 300 on a plane.

Next, the display area and the peripheral area of the organic light emitting diode display according to an embodiment will be described with reference to FIGS. 2-8.

Figure 2:
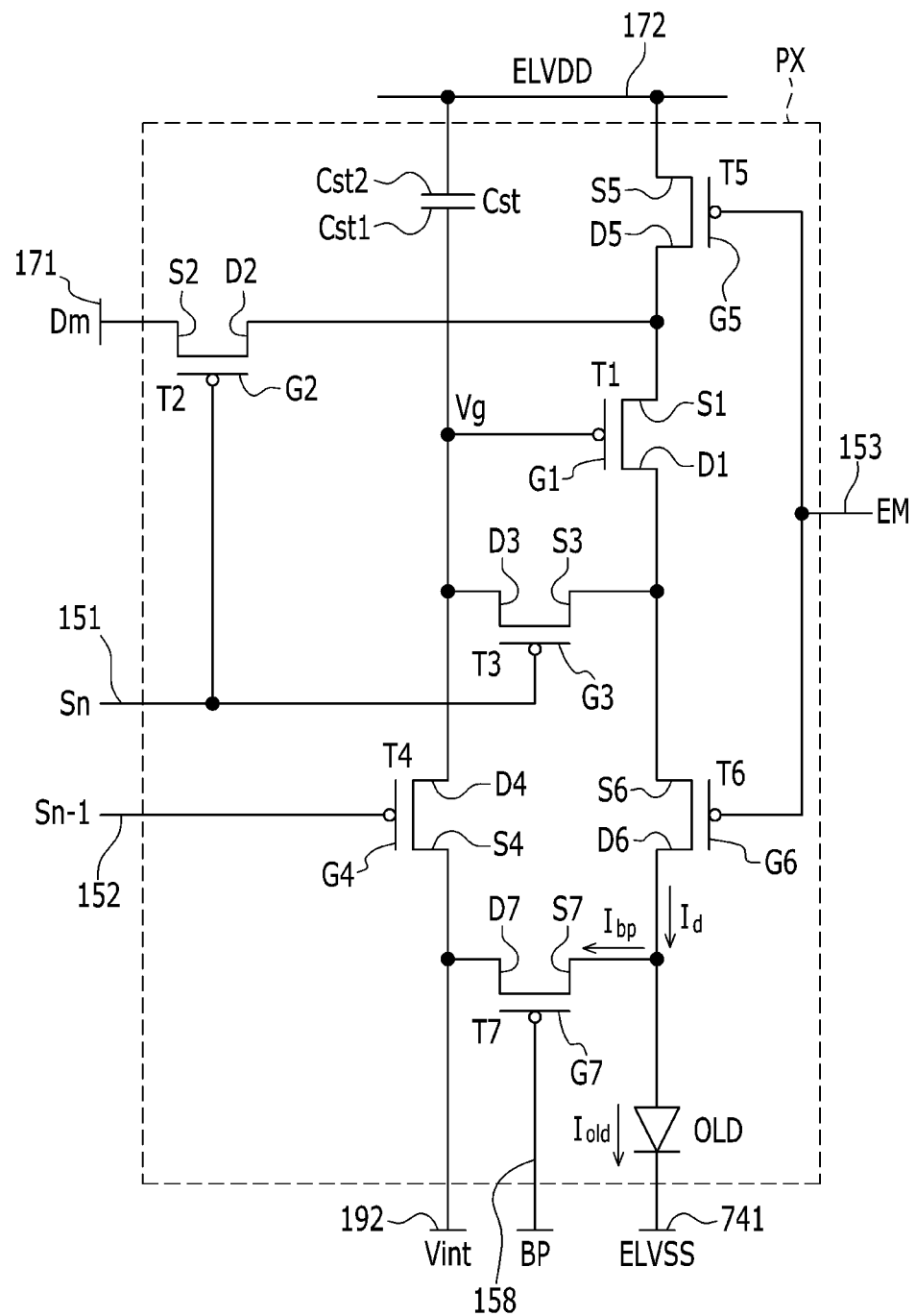
FIG. 2 is an equivalent circuit diagram of an organic light emitting diode display according to an embodiment.

FIG. 2 is an equivalent circuit diagram of an organic light emitting diode display according to an embodiment.

As illustrated in FIG. 2, the display area DA of the organic light emitting diode display according to an embodiment includes a plurality of signal lines 151, 152, 153, 158, 171, 172, and 192 and a plurality of pixels PXs which are connected to a plurality of signal lines and are arranged in an approximate matrix form.

One pixel PX includes a plurality of transistors T1, T2, T3, T4, T5, T6, and T7, a storage capacitor Cst, and an organic light emitting diode OLD that are connected to the plurality of signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transferring a scan signal Sn, a previous scan line 152 transferring a previous scan signal Sn-1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of an organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. The switching transistor T2 is turned on according to the scan signal Sn received through the scan line 151 to perform a switching operation of transferring the data signal Dm transferred to the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLD via the light emission control transistor T6, and a drain electrode D3 of the compensation transistor T3 is connected with one end Cst1 of the storage capacitor Cst and the drain electrode D4 of the initialization transistor T4 and the gate electrode G1 of the driving transistor T1 together. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal Sn-1 received through the previous scan line 152 to transfer the initialization voltage Vint to the gate electrode G1 of the driving transistor T1 and then perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected to the light emission control line 153, the source electrode S6 of the first light emission control transistor T6 is connected to the drain electrode D1 of the driving transistor T1 and the source electrode S3 of the compensation transistor T3, and the drain electrode D6 of the light emission control transistor T6 is electrically connected to the anode of the organic light emitting diode OLD. The operation control transistor T5 and the light emission control transistor T6 are simultaneously turned on according to the light emission control signal EM transmitted to the light emission control line 153 such that the driving voltage ELVDD is compensated through the diode-connected driving transistor T1 and is transmitted to the organic light emitting diode OLD.

A gate electrode G7 of the bypass transistor T7 is connected to the bypass control line 158, a source electrode S7 of the bypass transistor T7 is connected to the drain electrode D6 of the light emission control transistor T6 and the anode of the organic light emitting diode OLD together, and a drain electrode D7 of the bypass transistor T7 is connected to the initialization voltage line 192 and the source electrode S4 of the initialization transistor T4 together.

The other end Cst2 of the storage capacitor Cst is connected with the driving voltage line 172, and a cathode of the organic light emitting diode OLD is connected with a common voltage line 741 transferring a common voltage ELVSS.

A 7-transistor and 1-capacitor structure including the bypass transistor T7 is described in one embodiment of the present disclosure, however the present disclosure is not limited thereto, and the number of transistors and the number of capacitors may be variously changed.

Next, a detailed structure of the pixel formed in the display area DA and the sealant and the fan-out lines formed in the peripheral area PA in the organic light emitting diode display shown in FIG. 1 and FIG. 2 will be described with reference to FIGS. 3-8.

Figure 3:
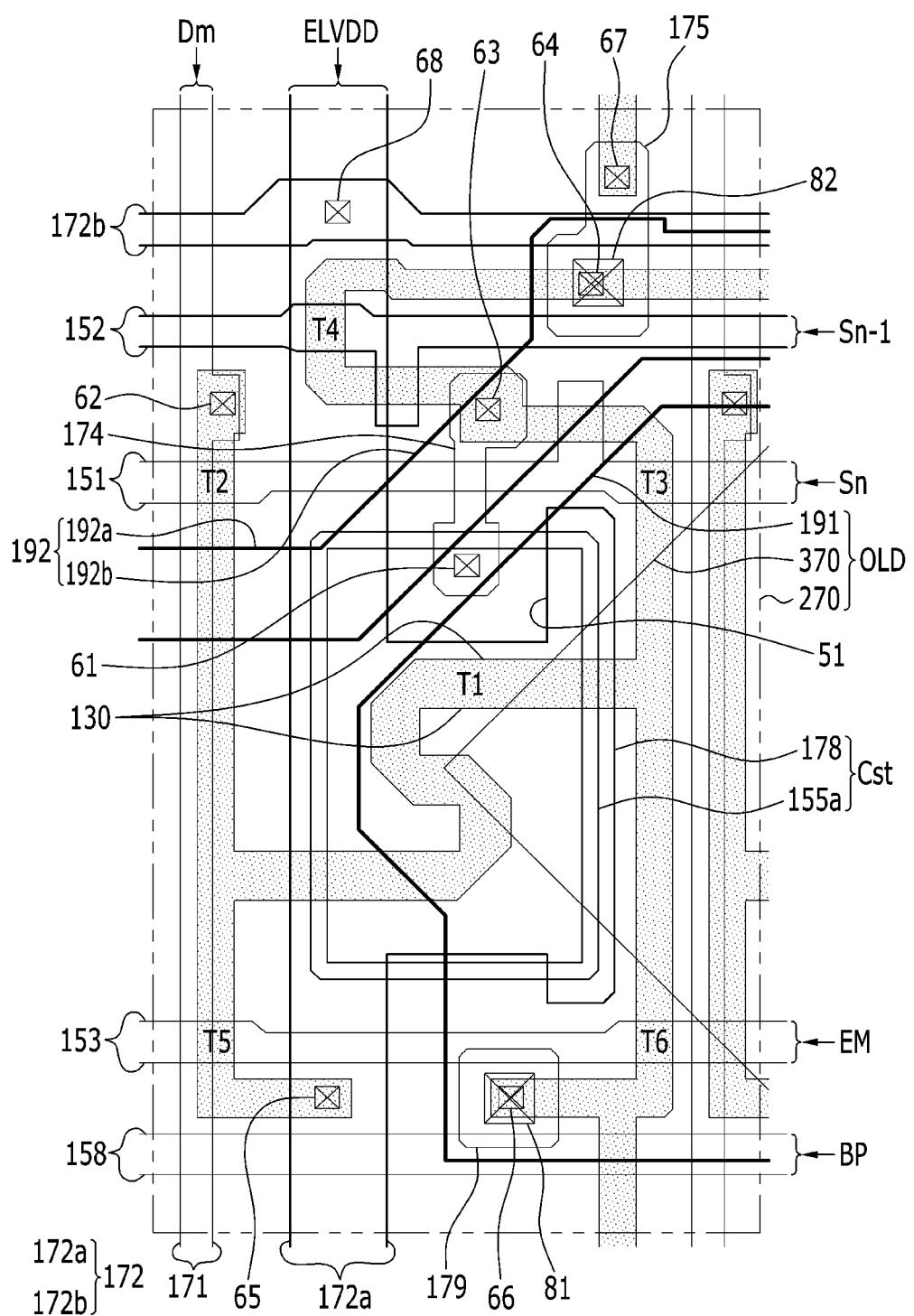
FIG. 3 is a view schematically illustrating a plurality of transistors and a capacitor formed in a display area DA of an organic light emitting diode display according to an embodiment.
Figure 4:
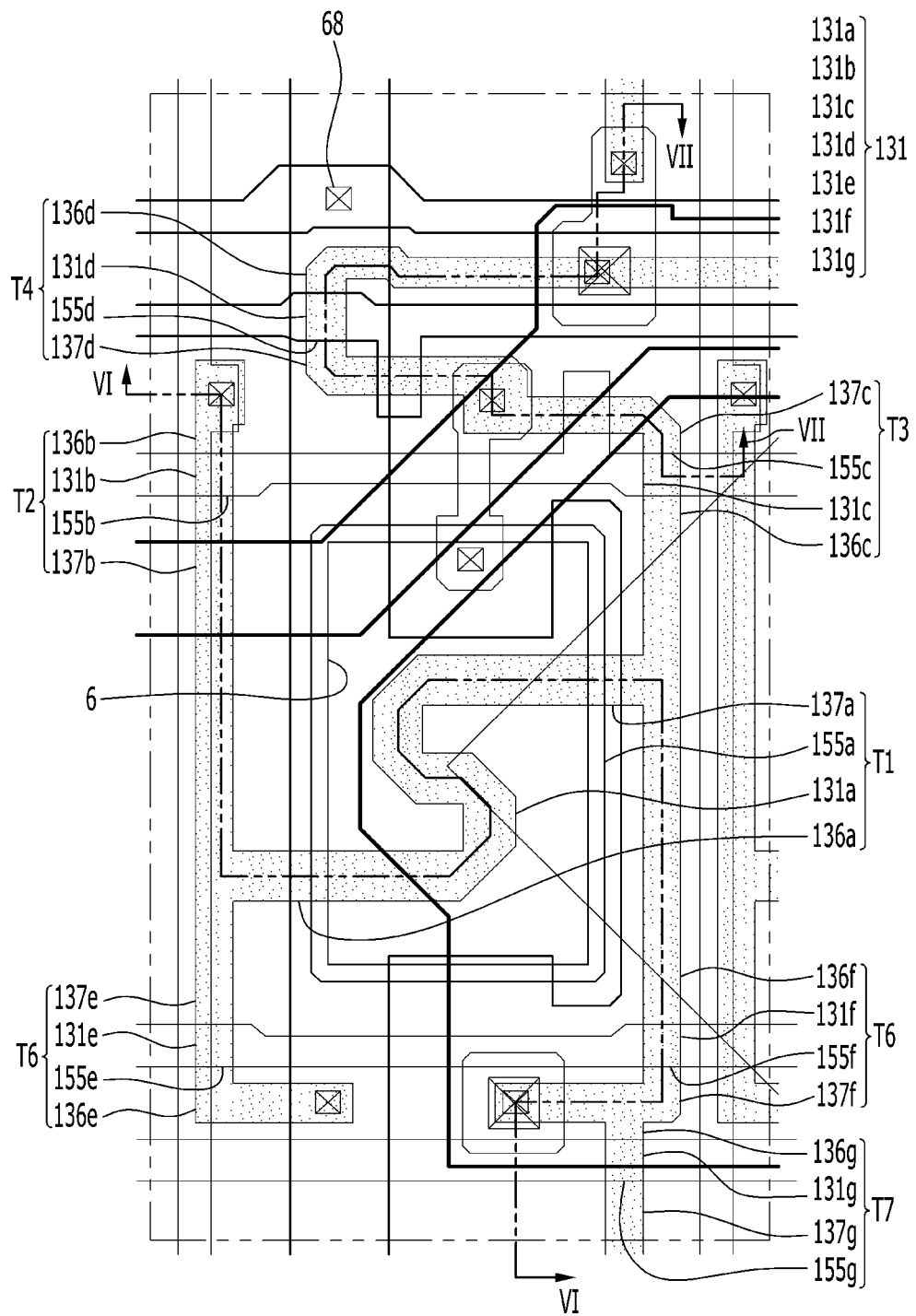
FIG. 4 is a detailed layout view of FIG. 3.
Figure 5:
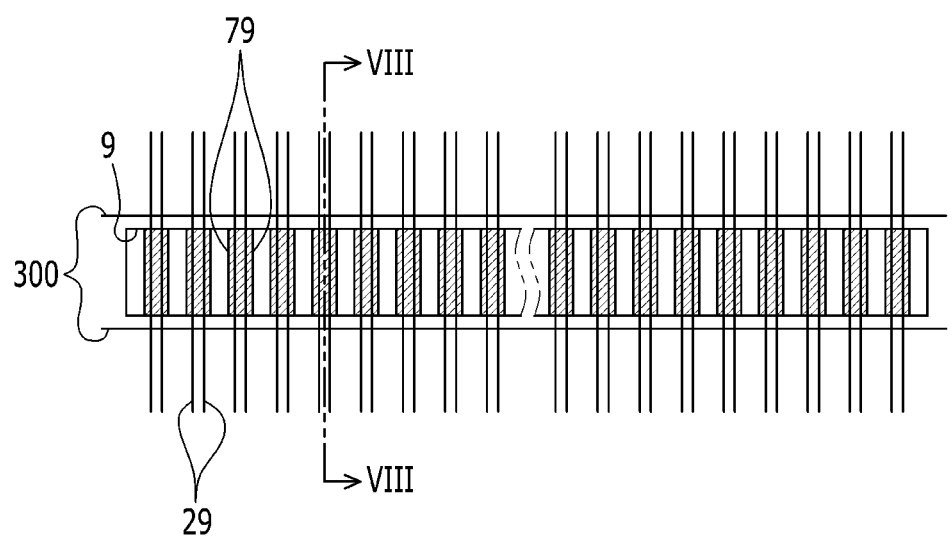
FIG. 5 is a layout view of a fan-out line and an etching preventing member formed in a peripheral area of an organic light emitting diode display according to an embodiment.
Figure 6:
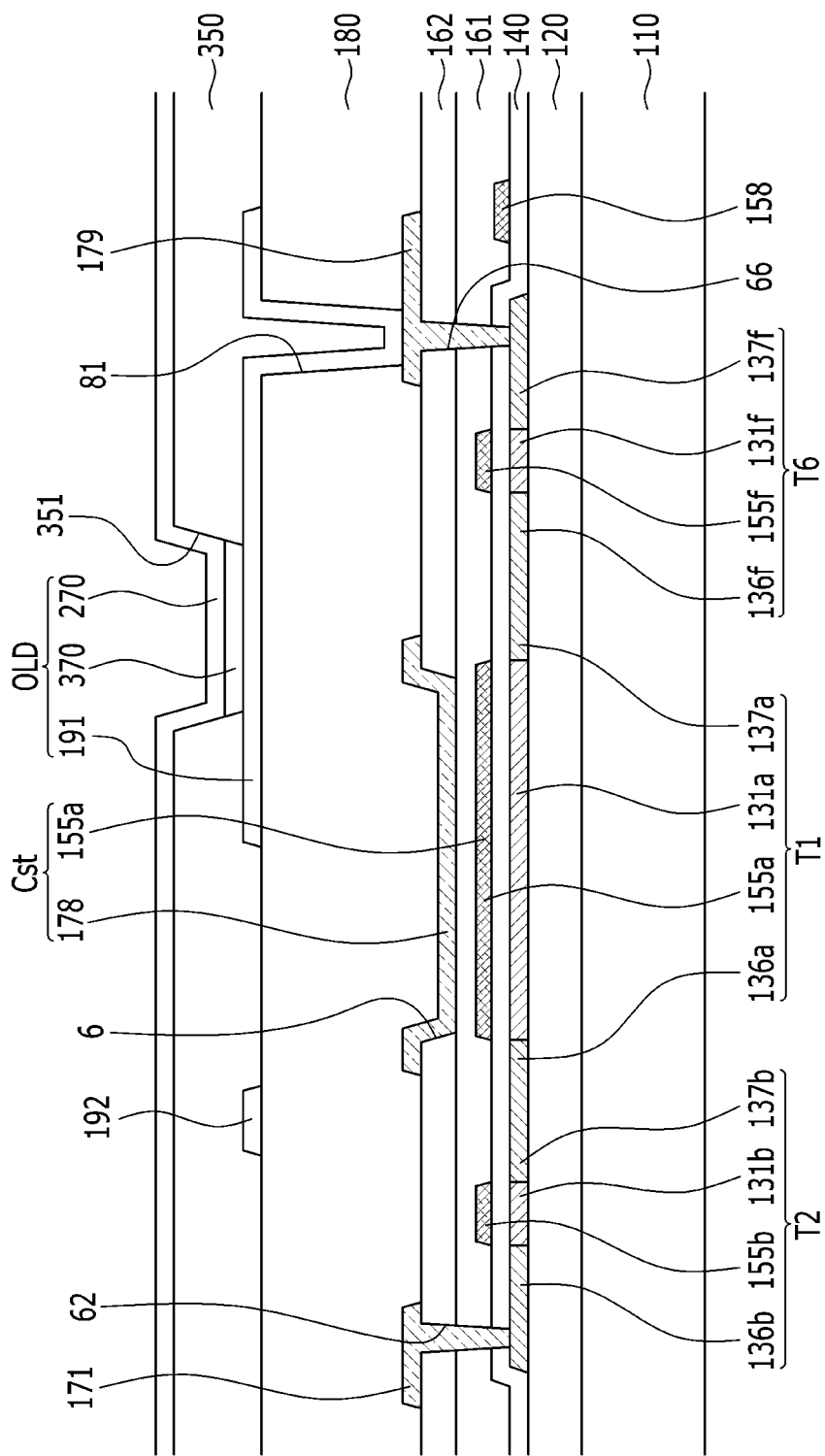
FIG. 6 is a cross-sectional view taken along a line VI-VI of FIG. 4.
Figure 7:
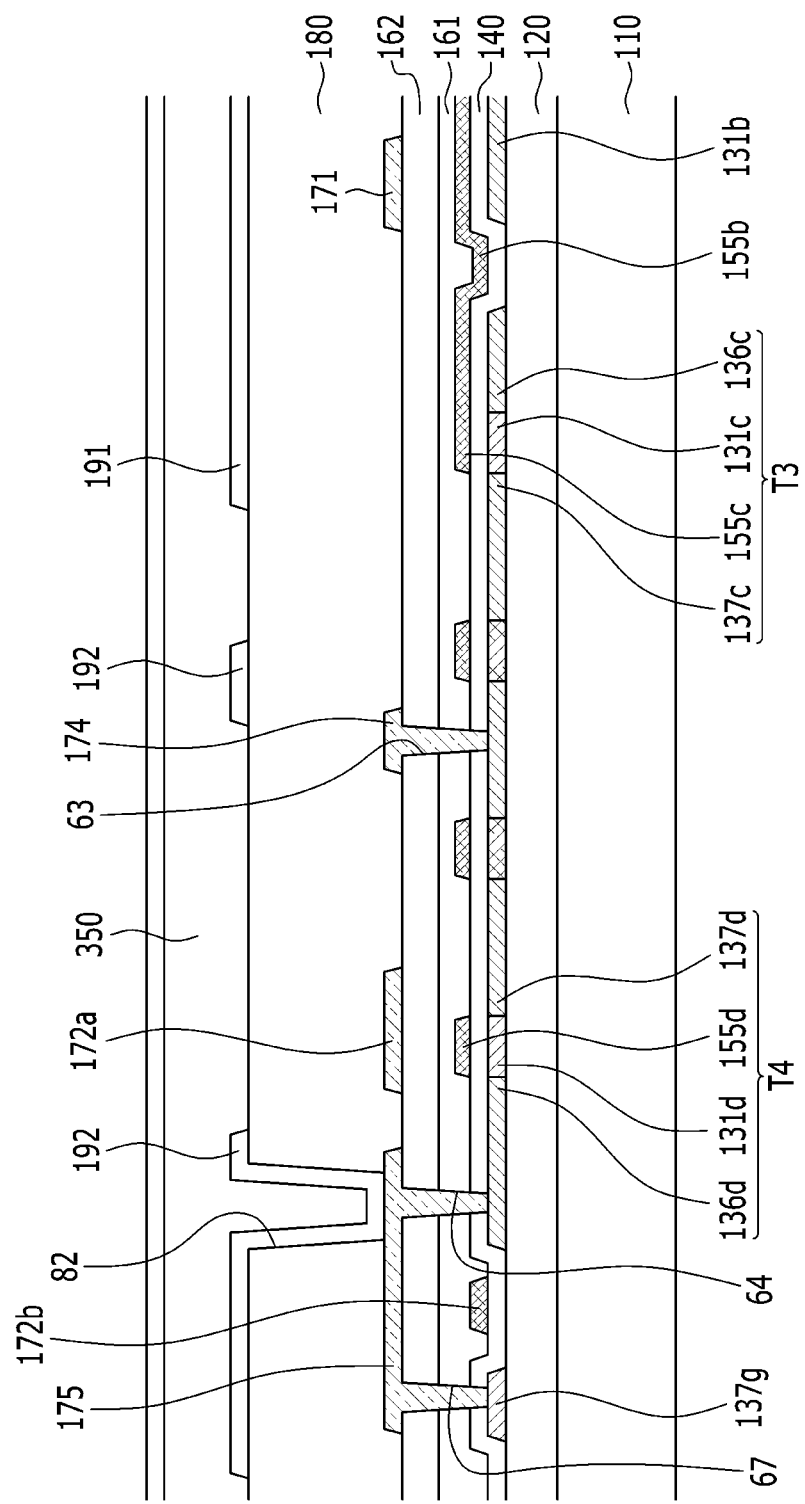
FIG. 7 is a cross-sectional view taken along a line VII-VII of FIG. 4.
Figure 8:
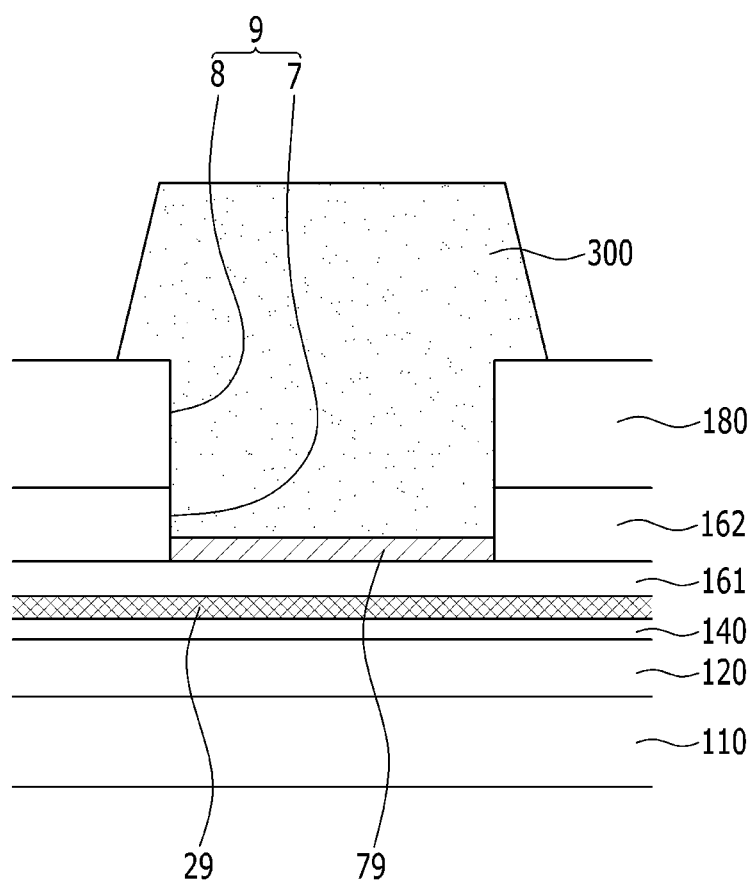
FIG. 8 is a cross-sectional view taken along a line VIII-VIII of FIG. 5.

FIG. 3 is a view schematically illustrating a plurality of transistors and a capacitor formed in a display area DA of an organic light emitting diode display according to an embodiment, FIG. 4 is a detailed layout view of FIG. 3, FIG. 5 is a layout view formed in a fan-out line and an etching preventing member formed in a peripheral area of an organic light emitting diode display according to an embodiment, FIG. 6 is a cross-sectional view taken along a line VI-VI of FIG. 4, FIG. 7 is a cross-sectional view taken along a line VII-VII of FIG. 4, and FIG. 8 is a cross-sectional view taken along a line VIII-VIII of FIG. 5.

Hereinafter, a detailed planar structure of the organic light emitting diode display according to an embodiment will be described with reference to FIGS. 3-5, and then a cross-sectional structure will be described with reference to FIGS. 6-8.

As shown in FIG. 3 and FIG. 4, the display area DA of the organic light emitting diode display according to an embodiment includes the scan line 151, a previous scan line 152, the emission control line 153, and the bypass control line 158 all formed along a row direction, and respectively transmitting a scan signal Sn, a previous scan signal Sn-1, an emission control signal EM, and a bypass signal BP to the pixel PX. Further, the pixel part includes the data line 171 and the driving voltage line 172 which intersect the scan line 151, the previous scan line 152, the light emission control line 153, and the bypass control line 158, and respectively apply the data signal Dm and the driving voltage ELVDD to the pixel PX. The driving voltage line 172 includes a first driving voltage line 172a parallel to the data line 171 and a second driving voltage line 172b parallel to the scan line 151. The first driving voltage line 172a and the second driving voltage line 172b are connected through a contact hole 68 to each other. Accordingly, compared to the case in which the first driving voltage line 172a is only formed to extend in a vertical direction to transmit the driving voltage ELVDD, an embodiment of connects the first driving voltage line 172a elongated in a vertical direction and the second driving voltage line 172b elongated in a horizontal direction through the contact hole 68 to have a mesh structure, thereby minimizing a voltage drop of the driving voltage line 172.

The initialization voltage Vint is transferred from the initialization voltage line 192 to the compensation transistor T3 via the initialization transistor T4. The initialization voltage line 192 alternately includes a straight portion 192a and an oblique portion 192b. The straight portion 192a is disposed to be parallel to the scan line 151, and the oblique portion 192b extends at a predetermined angle to the straight portion 192a.

Also, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode OLD.

The organic light emitting diode OLD includes a pixel electrode 191, an organic emission layer 370, and a common electrode 270. The compensation transistor T3 and the initialization transistor T4 are configured as transistors having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130 which may be bent in various shapes. The semiconductor 130 may include polysilicon or an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), or zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O) which are complex oxides thereof. In the case where the semiconductor 130 includes the oxide semiconductor material, a separate passivation layer for protecting the oxide semiconductor material, which is vulnerable to an external environment such as a high temperature, may be added.

The semiconductor 130 includes a channel which is doped with an N-type impurity or a P-type impurity, and a source doping part and a drain doping part which are formed at respective sides of the channel and doped with an opposite-type doping impurity to the doping impurity doped on the channel. In one embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 4, the channel 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a may be curved and may have a meandering shape or a zigzag shape. As such, by forming the curved driving channel 131a, the driving channel 131a may be formed to be elongated in a narrow space. Accordingly, a driving range of the driving gate-source voltage Vgs between the driving gate electrode 155a and the driving source electrode 136a is increased by the elongated driving channel 131a. Since the driving range of the gate voltage is increased, a gray scale of light emitted from the organic light emitting diode OLD may be finely controlled by changing the magnitude of the gate voltage, and as a result, the resolution of the organic light emitting diode display device may be enhanced and display quality may be improved. Various examples of shapes such as, for example, 'reverse S', 'S', 'M', and 'W' may be implemented by variously modifying the shape of the driving channel.

The driving gate electrode 155a overlaps the driving channel 131a, and the driving source electrode 136a and the driving drain electrode 137a are formed at respective sides of the driving channel 131a to be close. The driving gate electrode 155a is connected to the driving connecting member 174 through a contact hole 61.

The switching transistor T2 includes the switching channel 131b, a switching gate electrode 155b, a switching source electrode 136b, and a switching drain electrode 137b. The switching gate electrode 155b, which is a part extending downward from the scan line 151, overlaps the switching channel 131b, and the switching source electrode 136b and the switching drain electrode 137b are formed at respective sides of the switching channel 131b to be close thereto. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c, which is a part of the scan line 151, is formed as two in order to prevent current leakage, and it overlaps the compensation channel 131c. The compensation source electrode 136c and the compensation drain electrode 137c are formed to be adjacent to respective sides of the compensation channel 131c. The compensation drain electrode 137c is connected to a driving connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d that is a part of the previous scan line 152 is formed as two in order to prevent current leakage, and it overlaps the initialization channel 131d. The initialization source electrode 136d and the initialization drain electrode 137d are formed to be adjacent to respective sides of the initialization channel 131d. The initialization source electrode 136d is connected to an initialization connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e, which is a part of the light emission control line 153, overlaps the operation control channel 131e, and the operation control source electrode 136e and the operation control drain electrode 137e are formed to be adjacent to respective sides of the operation control channel 131e. The operation control source electrode 136e is connected to the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f, which is a part of the light emission control line 153, overlaps the light emission control channel 131f, and the light emission control source electrode 136f and the light emission control drain electrode 137f are formed to be adjacent to respective sides of the light emission control channel 131f. The light emission control drain electrode 137f is connected to a pixel connecting member 179 through a contact hole 66.

The bypass transistor T7 includes the bypass channel 131g, a bypass gate electrode 155g, a bypass source electrode 136g, and a bypass drain electrode 137g. The bypass gate electrode 155g, which is a part of the bypass control line 158, overlaps the bypass channel 131g, and the bypass source electrode 136g and the bypass drain electrode 137g are formed to be adjacent to respective sides of the bypass channel 131g.

The bypass source electrode 136g is directly connected to the light emission control drain electrode 137f, and the bypass drain electrode 137g is directly connected to the initialization connecting member 175 through the contact hole 67.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 disposed via a first interlayer insulating layer 161 interposed therebetween. The first storage electrode 155a corresponds to the driving gate electrode 155a, and the second storage electrode 178 is an expanding region of the first driving voltage line 172a and is formed one by one for each pixel. The first interlayer insulating layer 161 serves as a dielectric material, and a storage capacitance is determined by a charge charged to the storage capacitor Cst and a voltage between the electrodes 155a and 178. As described above, by using the driving gate electrode 155a as the first storage electrode 155a, a space for forming the storage capacitor may be obtained in the space that is decreased by the driving channel 131a occupying a large area in the pixel. Also, since the second storage electrode 178 is filled in a storage opening 6 formed in a second interlayer insulating layer 162 by using a half tone mask, the first interlayer insulating layer 161 is only positioned between the second storage electrode 178 and the first storage electrode 155a. Accordingly, the distance between the second storage electrode 178 and the first storage electrode 155a is decreased such that the storage capacitance may be increased.

The first storage electrode 155a as the driving gate electrode 155a is connected to one end of the driving connecting member 174 through the contact hole 61 and a storage groove 51. The storage groove 51 is a groove formed in the second storage electrode 178. Accordingly, the contact hole 61 connecting one end of the driving connecting member 174 and the driving gate electrode 155a is formed inside the storage groove 51. The driving connecting member 174 is almost parallel to the data line 171 and is formed of the same layer, and the other end of the driving connecting member 174 is connected to the compensation drain electrode 137c of the compensation transistor T3 and the initialization drain electrode 137d of the initialization transistor T4 through the contact hole 63. Accordingly, the driving connecting member 174 connects the driving gate electrode 155a and the compensation drain electrode 137c of the compensation transistor T3 and the initialization drain electrode 137d of the initialization transistor T4 to each other.

The second storage electrode 178 is an expansion region extended from the first driving voltage line 172a. Accordingly, the storage capacitor Cst stores the storage capacitance corresponding to a difference between the driving voltage ELVDD transmitted to the second storage electrode 178 through the driving voltage line 172 and the gate voltage Vg of the driving gate electrode 155a. As described above, by forming the portion of the first driving voltage line 172a as the second storage electrode 178, it is not necessary for the second storage electrode to be formed as a separate layer, and thus the number of masks used in manufacturing such may be reduced. In this case, a total of 7 masks are used from the semiconductor 130 to the common electrode 270, and this manufacturing method is referred to as a 7 mask process, while the structure of the organic light emitting diode display manufactured by the 7 mask process is referred to as a 7 mask structure.

The data line 171 crosses the scan line 151 and extends in a column direction, and the driving voltage line 172 is separated from the data line 171 and extends in the column direction.

A pixel connecting member 179 with a square shape is connected to the pixel electrode 191 through a contact hole 81, and the initialization connecting member 175 is connected to the initialization voltage line 192 through a contact hole 82.

As shown in FIG. 5, in the peripheral area PA of the organic light emitting diode display according to an embodiment, a plurality of fan-out lines 29 electrically connecting the pixel PX and the driving circuit chip IC are formed. A plurality of etching preventing members 79 respectively covering the plurality of fan-out lines 29 are formed on the plurality of fan-out lines 29. The etching preventing members 79 are etching preventing members of a single type respectively overlapping the plurality of fan-out lines 29. Accordingly, the plurality of etching preventing members 79 are divided to be separated from each other. The etching preventing members 79 are positioned at a sealant opening 9 formed together in the second interlayer insulating layer 162 and a passivation layer 180 covering the plurality of fan-out lines 29. The sealant 300 is filled in the sealant opening 9.

As described above, since the etching preventing members 79 cover the fan-out lines 29, damage to the fan-out lines 29 due to an etchant inflowed through the sealant opening 9 may be prevented in the etching process of the pixel electrode.

Hereinafter, the cross-sectional structure of the display area DA and the peripheral area PA of the organic light emitting diode display according to an embodiment will be described according to the stacked order with reference to FIGS. 6-8.

The operation control transistor T5 is substantially the same as the stacked structure of the light emission control transistor T6, and therefore a detailed description thereof will be omitted.

A buffer layer 120 is formed on a substrate 110 of the display area DA and the peripheral area PA. The substrate 110 may be formed as an insulating substrate which includes glass, quartz, ceramic, plastic, or the like. The buffer layer 120 serves to block impurities from the substrate 110 to improve characteristics of polysilicon at the time of a crystallization process for forming the polysilicon and planarize the substrate 110 to mitigate stress of the semiconductor formed on the buffer layer 120. The buffer layer 120 may include a silicon nitride (SiNx), a silicon oxide (SiOx), or the like.

The semiconductor 130 including the channel 131, which includes the driving channel 131a, the switching channel 131b, the compensation channel 131c, the initialization channel 131d, the operation control channel 131e, the light emission channel 131f, and the bypass channel 131g, is formed on the buffer layer 120 of the display area DA. The driving source electrode 136a and the driving drain electrode 137a are formed at respective sides of the driving channel 131a among the semiconductor 130, and the switching source electrode 136b and the switching drain electrode 137b are formed at respective sides of the switching channel 131b. Further, the compensation source electrode 136c and the compensation drain electrode 137c are formed at respective sides of the compensation channel 131c and the initialization source electrode 136d, and the initialization source electrode 136d and the initialization drain electrode 137d are formed at respective sides of the initialization channel 131d. In addition, the operation control source electrode 136e and the operation control drain electrode 137e are formed at respective sides of the operation control channel 131e, and the light emission control source electrode 136f and the light emission control drain electrode 137f are formed at respective sides of the light emission control channel 131f. The bypass source electrode 136g and the bypass drain electrode 137g are formed at respective sides of the bypass channel 131g.

A gate insulating layer 140 covering the semiconductor 130 is formed thereon in both of the display area DA and the peripheral area PA. The switching gate electrode 155b, the scan line 151 including the compensation gate electrode 155c, the previous scan line 152 including the initialization gate electrode 155d, the emission control line 153 including the operation control gate electrode 155e and the emission control gate electrode 155f, the bypass control line 158 including the bypass gate electrode 155g, the driving gate electrode (first storage electrode) 155a, and the second driving voltage line 172b are formed on the gate insulating layer 140 of the display area DA, and as shown in FIG. 8, a fan-out line 29 is formed on the gate insulating layer 140 of the peripheral area PA.

A gate metal line (151, 152, 153, 158, 155a, 172b, and 29) including the scan line 151, the previous scan line 152, the light emission control line 153, the bypass control line 158, the driving gate electrode (first storage electrode) 155a, and the fan-out line 29 may be formed as a multilayer in which a metal layer including one of copper (Cu), a copper alloy, aluminum (Al), an aluminum alloy, molybdenum (Mo), or a molybdenum alloy is deposited.

A first interlayer insulating layer 161 covering the gate metal line (151, 152, 153, 158, 155a, 172b, and 29) and the gate insulating layer 140 is formed thereon in both of the display area DA and the peripheral area PA. The interlayer insulating layer 160 may include a silicon nitride (SiNx) or a silicon oxide (SiOx).

The second interlayer insulating layer 162 covering the first interlayer insulating layer 161 is formed thereon in both of the display area DA and the peripheral area PA. The second interlayer insulating layer 162 may include an organic material such as a polyacryl-based resin or a polyimide-based resin. The first interlayer insulating layer 161 and the second interlayer insulating layer 162 have a plurality of contact holes 61, 62, 63, 64, 65, 66, 67, and 68 passing through them. As described above, by forming the second interlayer insulating layer 162 having the plurality of contact holes 61, 62, 63, 64, 65, 66, 67, and 68 made of the organic material, when bending or folding the display substrate 110, the stress generated in the contact holes 61, 62, 63, 64, 65, 66, 67, and 68 may be minimized, thereby being applied to a flexible organic light emitting diode display.

The storage opening 6 is formed in the second interlayer insulating layer 162 on the first storage electrode 155a. The second storage electrode 178 is filled in the storage opening 6 such that the first interlayer insulating layer 161 only serves as the dielectric material between the second storage electrode 178 and the first storage electrode 155a. Accordingly, the distance between the second storage electrode 178 and the first storage electrode 155a is decreased, thereby increasing the storage capacitance.

Also, the first sealant opening 7 is formed in the second interlayer insulating layer 162 formed in the peripheral area PA such that the first interlayer insulating layer 161 is exposed.

The data line 171, the driving voltage line 172 including the second storage electrode 178, the driving connecting member 174, the initialization connecting member 175, and the pixel connecting member 179 are formed on the second interlayer insulating layer 162 of the display area DA.

The data line 171 is connected to the switching source electrode 136b through the contact hole 62 formed in the gate insulating layer 140, the first interlayer insulating layer 161, and the second interlayer insulating layer 162, and the first driving voltage line 172a partially extends to form the second storage electrode 178.

One end of the driving connecting member 174 is connected to the first storage electrode 155a through the contact hole 61 formed in the first interlayer insulating layer 161 and the second interlayer insulating layer 162, and the other end of the driving connecting member 174 is connected to the compensation drain electrode 137c and the initialization drain electrode 137d through the contact hole 63 formed in the gate insulating layer 140, the first interlayer insulating layer 161, and the second interlayer insulating layer 162.

The initialization connecting member 175 is connected to the initialization source electrode 136d through the contact hole 64 formed in the gate insulating layer 140, the first interlayer insulating layer 161, and the second interlayer insulating layer 162. Also, the pixel connecting member 179 is connected to the light emission control drain electrode 137f through the contact hole 66 formed in the gate insulating layer 140, the first interlayer insulating layer 161, and the second interlayer insulating layer 162.

As shown in FIG. 8, a plurality of etching preventing members 79 of a bar shape is formed in a first sealant opening 7 formed in the second interlayer insulating layer 162 of the peripheral area PA. The plurality of etching preventing members 79 are formed on the first interlayer insulating layer 161 exposed by the first sealant opening 7. The plurality of etching preventing members 79 respectively overlap the plurality of fan-out lines 29.

As such, since the plurality of etching preventing members 79 respectively cover the plurality of fan-out lines 29, the first interlayer insulating layer 161 may be prevented from being damaged by the etchant inflowed through the sealant opening 9 when etching the data metal line. Accordingly, since the first interlayer insulating layer 161 exposed by the sealant opening 9 is not damaged, the etchant inflowed through the sealant opening 9 may be prevented from being inflowed into the fan-out line 29 positioned under the first interlayer insulating layer 161 in the etching process of the pixel electrode 191. Accordingly, the fan-out line 29 overlapping the sealant opening 9 may be prevented from being damaged by the etchant in the etching process of the pixel electrode 191.

The data metal line (171, 172a, 174, 175, 178, 179, and 79) including the data line 171, the second storage electrode 178, the first driving voltage line 172a, the driving connecting member 174, the initialization connecting member 175, the pixel connecting member 179, and the etching preventing member 79 may be formed as a multilayer in which a metal layer including one of copper (Cu), a copper alloy, aluminum (Al), an aluminum alloy, molybdenum (Mo), or a molybdenum alloy is deposited, and may be formed as a triple layer of, for example, titanium/aluminum/titanium (Ti/Al/Ti), molybdenum/aluminum/molybdenum (Mo/Al/Mo), or molybdenum/copper/molybdenum (Mo/Cu/Mo).

The passivation layer 180 covering the data metal line (171, 172a, 174, 175, 178, and 179) and the second interlayer insulating layer 162 is formed thereon. The passivation layer 180 covers the data metal line (171, 172a, 174, 175, 178, and 179) to be flattened, thereby forming the pixel electrode 191 on the passivation layer 180 without a step. The passivation layer 180 has contact holes 81 and 82 and a second sealant opening 8. The passivation layer 180 may include an organic material such as a polyacryl-based resin, a polyimide-based resin, or a deposition layer of the organic material and an inorganic material.

The second sealant opening 8 is formed with the same pattern as the first sealant opening 7. The first sealant opening 7 and the second sealant opening 8 together form the sealant opening 9. The sealant opening 9 is filled with the sealant 300 such that the contact area between the sealant 300, and the second interlayer insulating layer 162 and the passivation layer 180 is widened, thereby improving the adherence of the sealant 300.

The pixel electrode 191 and the initialization voltage line 192 are formed on the passivation layer 180. The pixel connecting member 179 is connected to the pixel electrode 191 through the contact hole 81 formed in the passivation layer 180, and the initialization connecting member 175 is connected to the initialization voltage line 192 through the contact hole 82 formed in the passivation layer 180.

A pixel definition layer PDL 350 is formed on the passivation layer 180, the initialization voltage line 192, and the edge of the pixel electrode 191, and the pixel definition layer 350 has a pixel opening 351 exposing the pixel electrode 191. The pixel definition layer 350 may include the organic material such as a polyacrylate resin and a polyimide resin, or of silica-series inorganic materials.

The organic emission layer 370 is formed on the pixel electrode 191 exposed by the pixel opening 351, and the common electrode 270 is formed on the organic emission layer 370. The common electrode 270 is formed on the PDL 350 to be formed through the plurality of pixels PX. As such, an organic light emitting diode OLD is formed, which includes the pixel electrode 191, the organic emission layer 370, and the common electrode 270.

The pixel electrode 191 is an anode which is a hole injection electrode, and the common electrode 270 is a cathode which is an electron injection electrode. However, embodiments are not necessarily limited thereto, and the pixel electrode 191 may be the cathode and the common electrode 270 may be the anode according to a driving method of the foldable display device. Holes and electrons are injected into the organic emission layer 370 from the pixel electrode 191 and the common electrode 270, respectively, and excitons acquired by combining the injected holes and electrons fall from an excitation state to a ground state.

The organic emission layer 370 includes a low-molecular organic material or a high-molecular organic material such as poly(3,4-ethylenedioxythiophene) (PEDOT). Further, the organic emission layer 370 may be formed with multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be necessary to be used.

The white organic emission layer described in another example may be formed by one organic emission layer, and may include a configuration that emits white light by laminating a plurality of organic emission layers. As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member 200 protecting the organic light emitting diode OLD is formed on the common electrode 270, and the encapsulation member 200 and the substrate 110 are sealed by the sealant 300. The encapsulation member 200 may include one or more of various materials such as glass, quartz, ceramic, plastic, and a metal.

A manufacturing method of the organic light emitting diode display according to an embodiment is described with reference to accompanying drawings.

Figure 9:
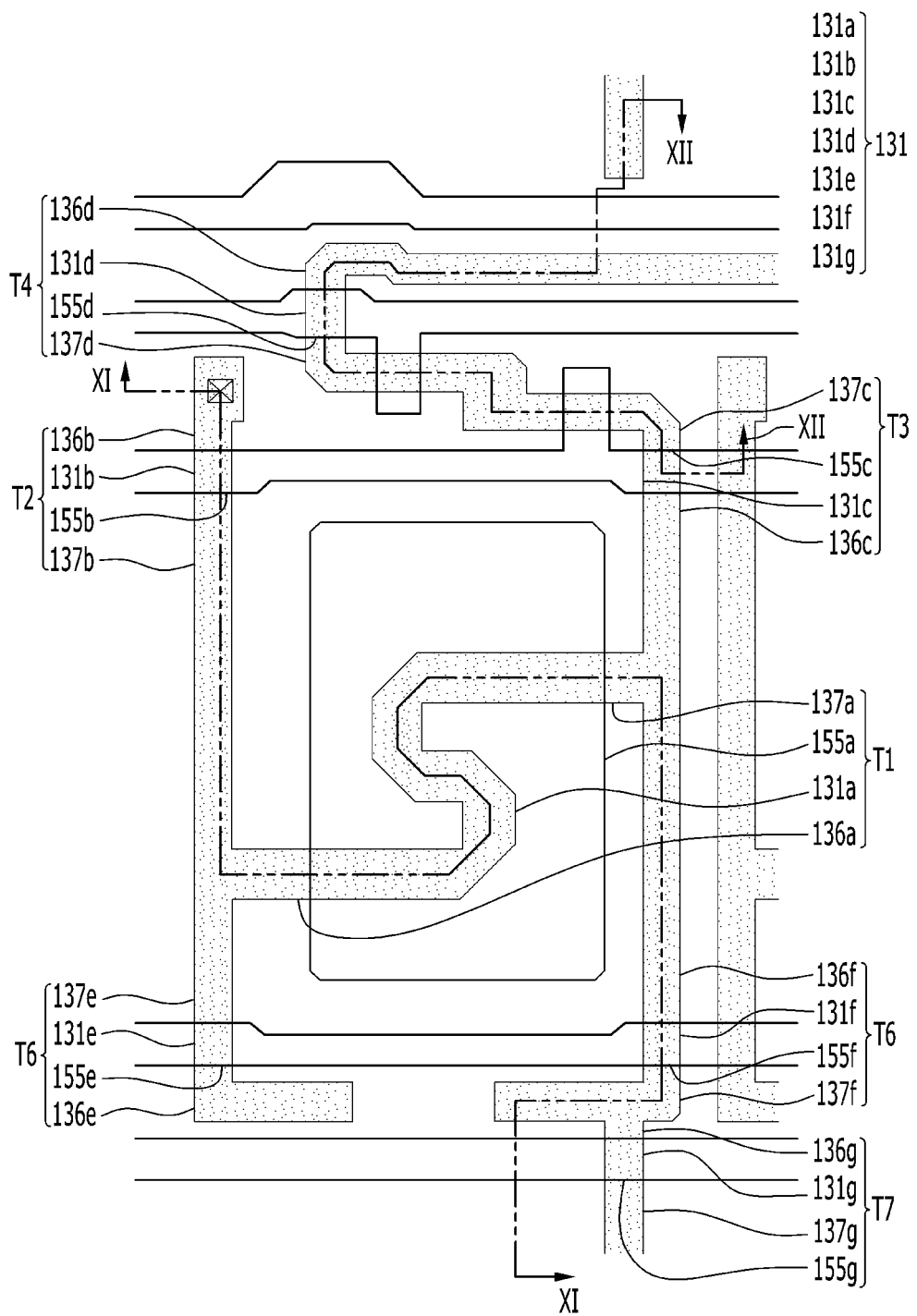
FIG. 9 is a layout view of one step in a manufacturing method of an organic light emitting diode display according to an embodiment showing a pixel formed in a display area.
Figure 10:
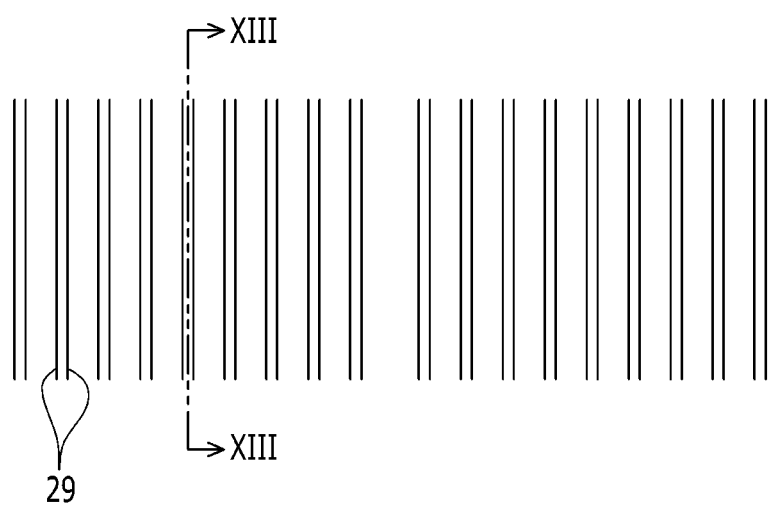
FIG. 10 is a layout view of a fan-out line formed in a peripheral area as a layout view of the same step as FIG. 9.
Figure 11:
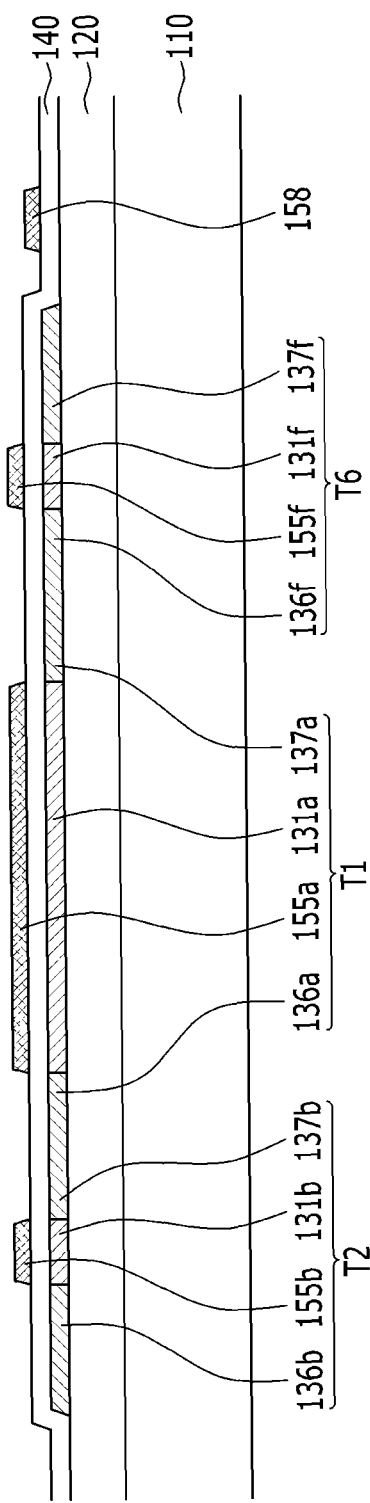
FIG. 11 is a cross-sectional view taken along a line XI-XI of FIG. 9.
Figure 12:
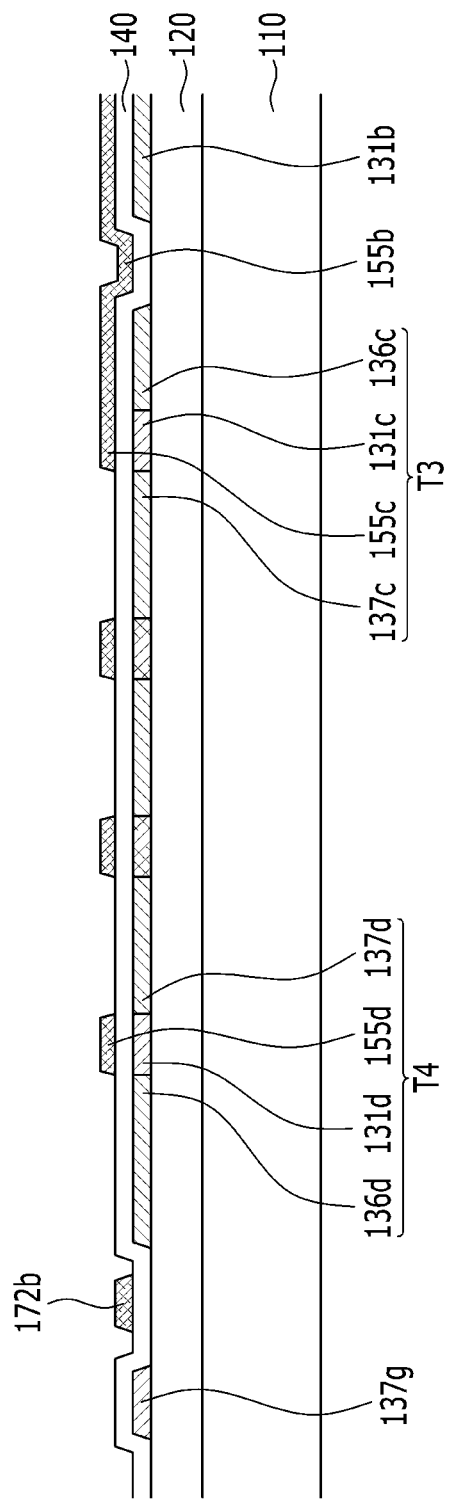
FIG. 12 is a cross-sectional view taken along a line XII-XII of FIG. 9.
Figure 13:
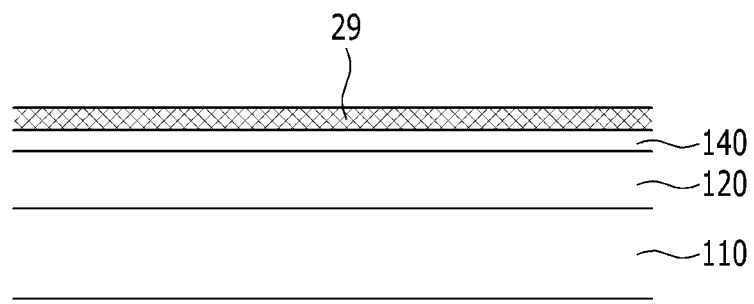
FIG. 13 is a cross-sectional view taken along a line XIII-XIII of FIG. 10.
Figure 14:
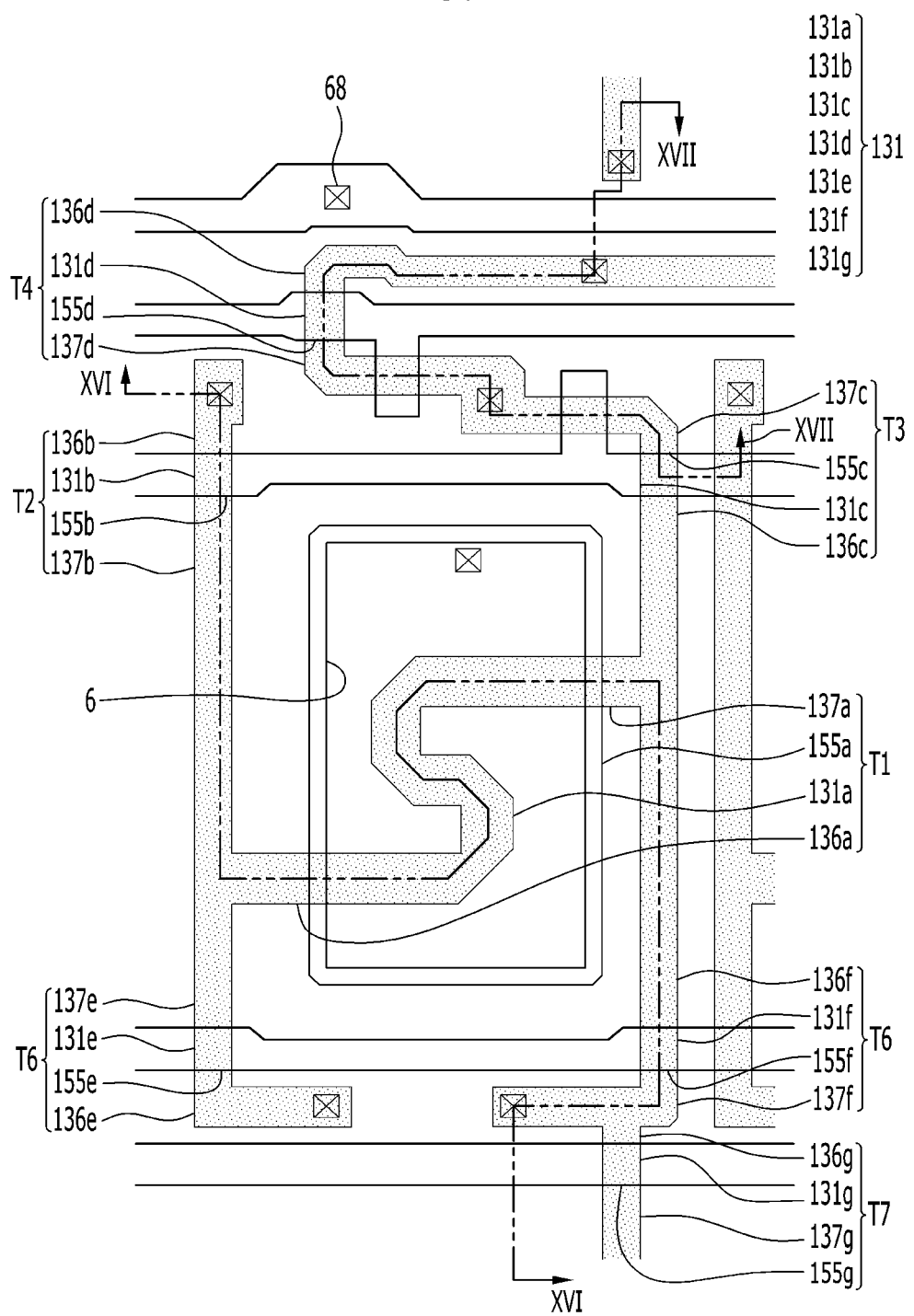
FIG. 14 is a layout view of a step after that of FIG. 9.
Figure 15:
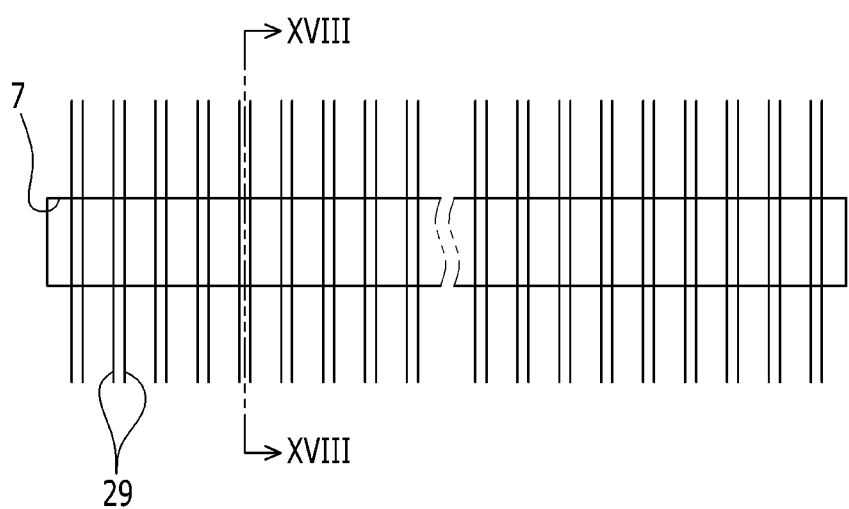
FIG. 15 is a layout view of a step after that of FIG. 10.
Figure 16:
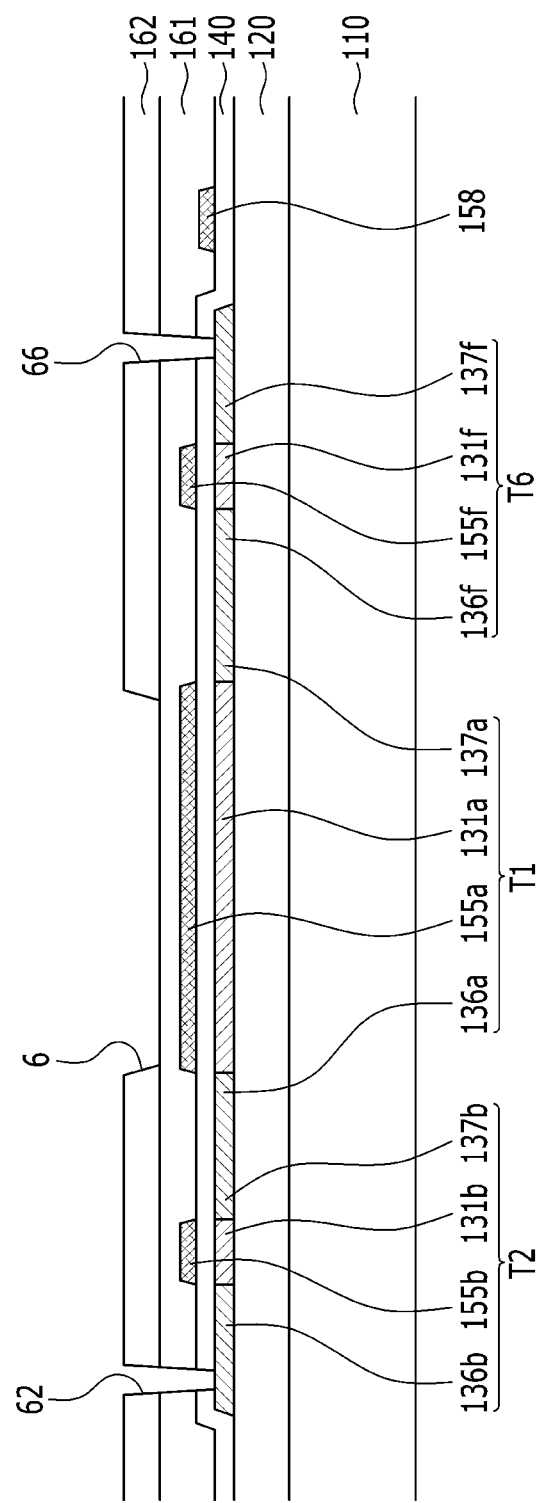
FIG. 16 is a cross-sectional view taken along a line XVI-XVI of FIG. 14.
Figure 17:
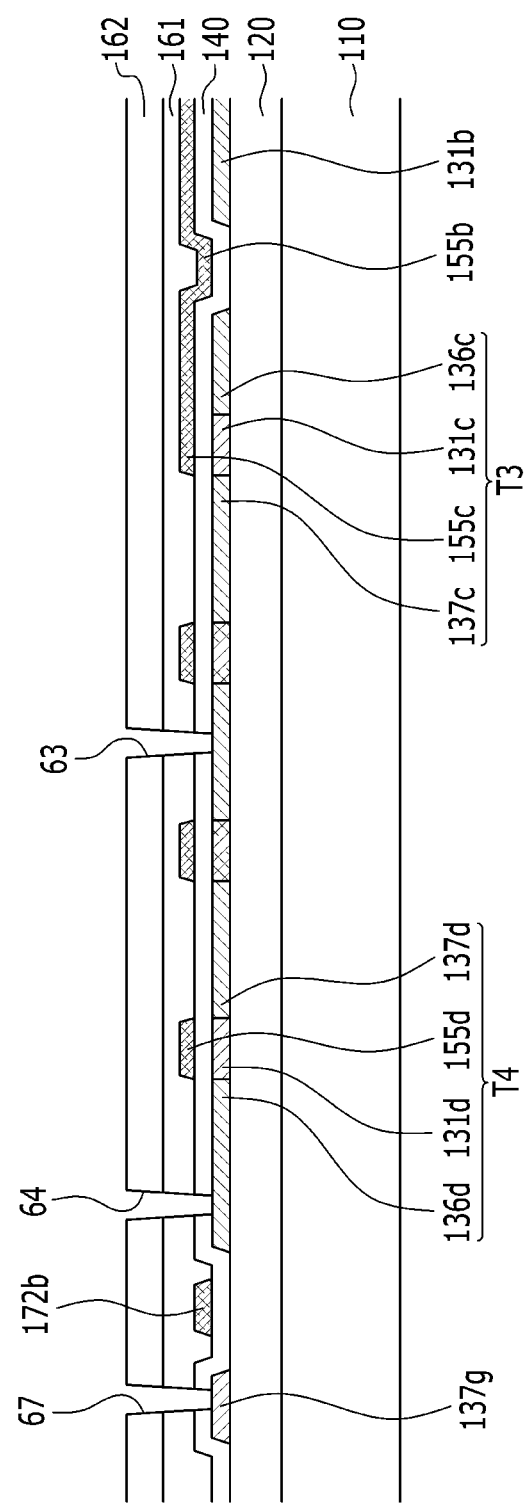
FIG. 17 is a cross-sectional view taken along a line XVII-XVII of FIG. 14.
Figure 18:
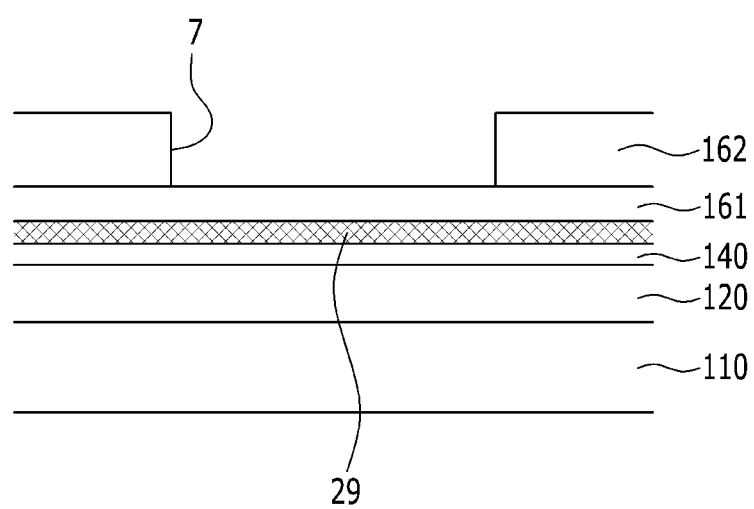
FIG. 18 is a cross-sectional view taken along a line XVIII-XVIII of FIG. 15.

FIG. 9 is a layout view of one step in a manufacturing method of an organic light emitting diode display according to an embodiment showing a pixel formed in a display area, FIG. 10 is a layout view of a fan-out line formed in a peripheral area as a layout view of the same step as FIG. 9, FIG. 11 is a cross-sectional view taken along a line XI-XI of FIG. 9, FIG. 12 is a cross-sectional view taken along a line XII-XII of FIG. 9, FIG. 13 is a cross-sectional view taken along a line XIII-XIII of FIG. 10, FIG. 14 is a layout view of a step after that of FIG. 9, FIG. 15 is a layout view of a step after that of FIG. 10, FIG. 16 is a cross-sectional view taken along a line XVI-XVI of FIG. 14, FIG. 17 is a cross-sectional view taken along a line XVI-XVI of FIG. 14, and FIG. 18 is a cross-sectional view taken along a line XVIII-XVIII of FIG. 15.

First, as shown in FIGS. 9-13, the buffer layer 120 is formed on the substrate 110. The buffer layer 120 may be formed as a single layer of a silicon nitride or a laminate layer of a silicon nitride and a silicon oxide, and is deposited on an entire surface of the substrate 110 by a method such as plasma enhanced chemical vapor deposition (PECVD). The semiconductor 130 is formed on the buffer layer 120. The semiconductor 130 may include a polysilicon layer or an oxide semiconductor layer, and the polysilicon layer may be formed by a method of forming an amorphous silicon layer and then crystallizing the amorphous silicon layer. Various known methods may be applied as the crystallizing method, and for example, the amorphous silicon layer may be crystallized by using heat, laser, Joule heat, an electric field, a catalyst metal, or the like. Further, the semiconductor is patterned into the semiconductor 130 having the form illustrated in FIG. 9 by performing a photolithography process using a first mask on the semiconductor layer. In this case, the semiconductor 130 is not doped, so that the semiconductor 130 is not divided into the channel, the source electrode, and the drain electrode configuring each transistor.

The gate insulating layer 140 covering the buffer layer 120 and the semiconductor 130 is formed thereon. The gate insulating layer 140 is formed by depositing a silicon nitride (SiNx) or a silicon oxide (SiOx) on a front surface thereof by a method of plasma chemical vapor deposition PECVD and the like. The gate metal layer is deposited on the gate insulating layer 140. The gate metal layer may be formed as a multilayer in which a metal layer including any one of copper (Cu), a copper alloy, aluminum (Al), an aluminum alloy, molybdenum (Mo), and a molybdenum alloy is stacked.

The gate metal layer is patterned by the photolithography process by using a second mask. The scan line 151, the previous scan line 152, the light emission control line 153, the bypass control line 158, and the driving gate electrode (the first storage electrode) 155a are formed on the gate insulating layer 140 of the display area DA, and as shown in FIG. 10 and FIG. 13, the fan-out line 29 is formed on the gate insulating layer 140 of the peripheral area PA.

The semiconductor 130 is doped with the impurity. The semiconductor 130 is doped in the region that is exposed except for the portion that is respectively covered by the switching gate electrode 155b, the compensation gate electrode 155c, the initialization gate electrode 155d, the operation control gate electrode 155e, the light emission control gate electrode 155f, the bypass gate electrode 155g, and the driving gate electrode 155a. As a result, the source electrode and the drain electrode in each transistor are formed. The channel 131 of each transistor is formed in the region that is covered by the semiconductor 130 to not be doped. That is, the driving channel 131a, the switching channel 131b, the compensation channel 131c, the initialization channel 131d, the operation control channel 131e, the light emission control channel 131f, and the bypass channel 131g are simultaneously formed. As such, when doping the semiconductor 130, a separate mask is not necessary.

Next, as shown in FIGS. 14-18, the first interlayer insulating layer 161 covering the gate metal line (151, 152, 153, 158, 155a, 172b, and 29) and the gate insulating layer 140 is formed thereon. The first interlayer insulating layer 161 is formed by depositing a silicon nitride (SiNx) or a silicon oxide (SiOx) on a front surface thereof by a method of plasma enhanced chemical vapor deposition (PECVD) and the like. The second interlayer insulating layer 162 is formed on the first interlayer insulating layer 161. The second interlayer insulating layer 162 includes the organic material such as a polyacrylate resin or a polyimide resin.

The gate insulating layer 140, the first interlayer insulating layer 161, and the second interlayer insulating layer 162 are simultaneously patterned by using a third mask as the half tone mask by the photolithography process to form the plurality of contact holes 61, 62, 63, 64, 65, 66, 67, and 68, the storage opening 6, and the first sealant opening 7.

This is described with reference to accompanying drawings.

Figure 19:
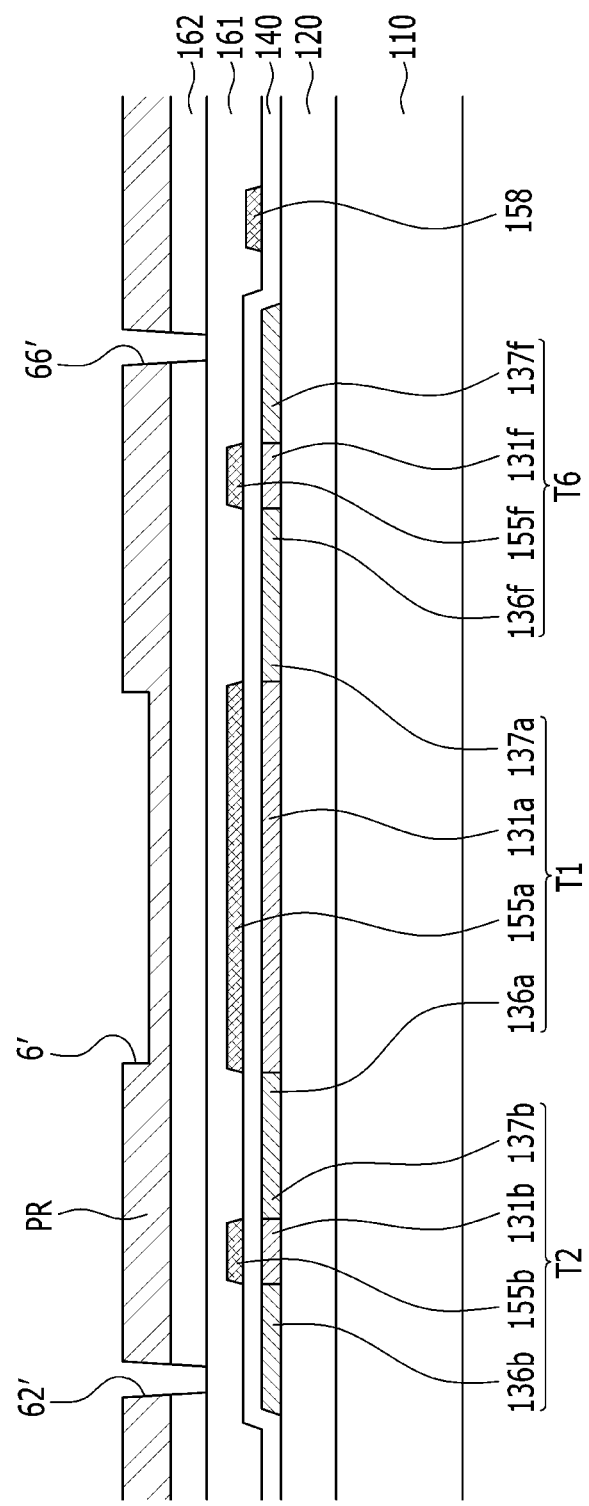
FIG. 19 is a cross-sectional view showing a step etching a second interlayer insulating layer by using a half-tone mask taken along a position corresponding to the line XVI-XVI of FIG. 14.
Figure 20:
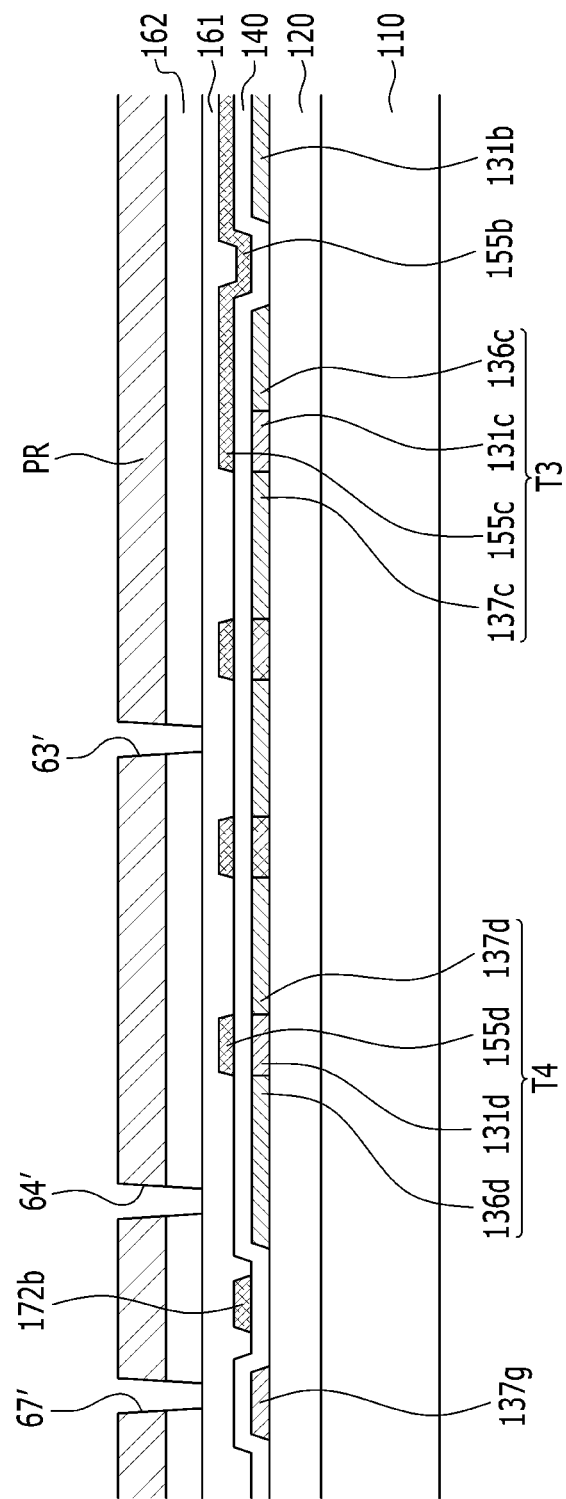
FIG. 20 is a cross-sectional view showing a step etching a second interlayer insulating layer by using a half-tone mask taken along a position corresponding to the line XVII-XVII of FIG. 14.
Figure 21:
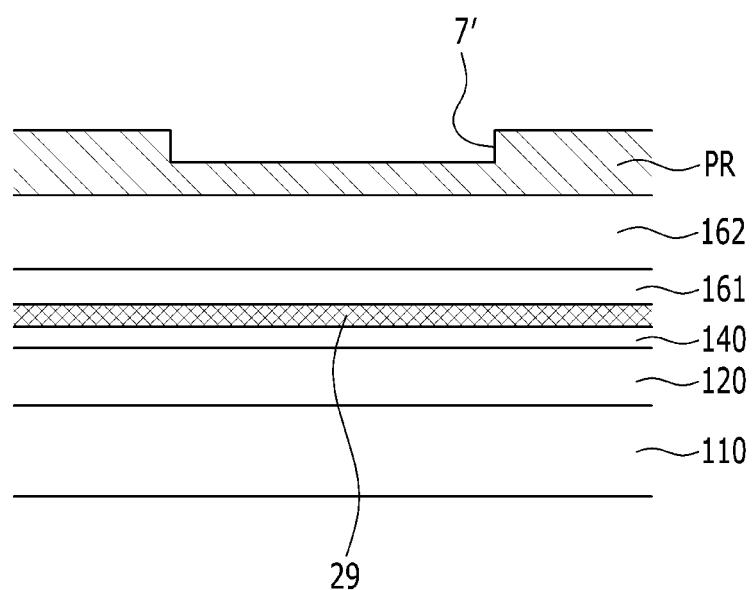
FIG. 21 is a cross-sectional view showing a step of etching a second interlayer insulating layer by using a half-tone mask taken along a position corresponding to a line XVIII-XVIII of FIG. 15.
Figure 22:
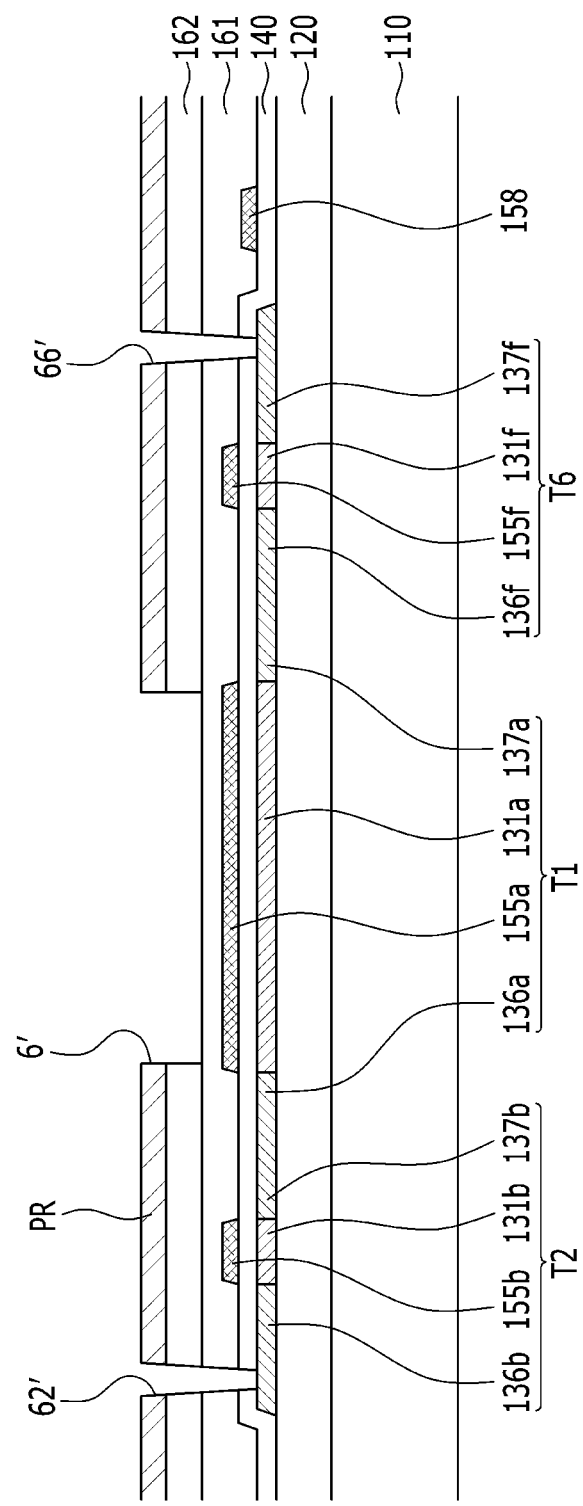
FIG. 22 is a view showing a step after that of FIG. 19.
Figure 23:
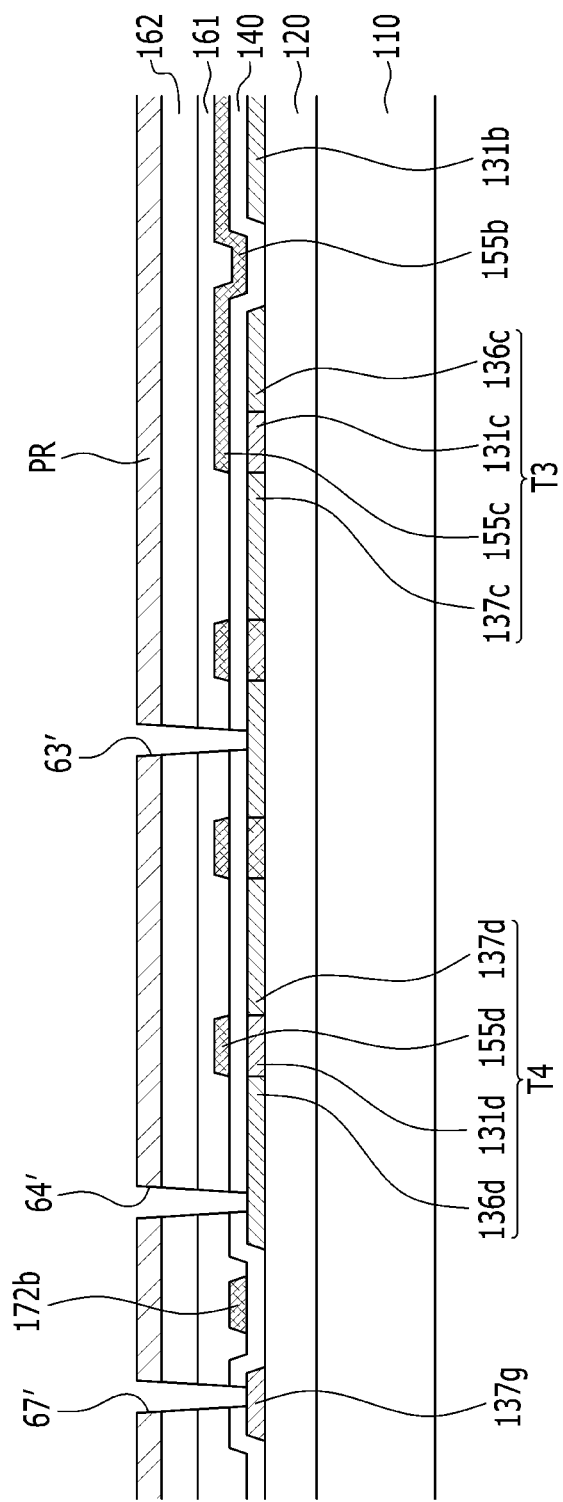
FIG. 23 is a view showing a step after that of FIG. 20.
Figure 24:
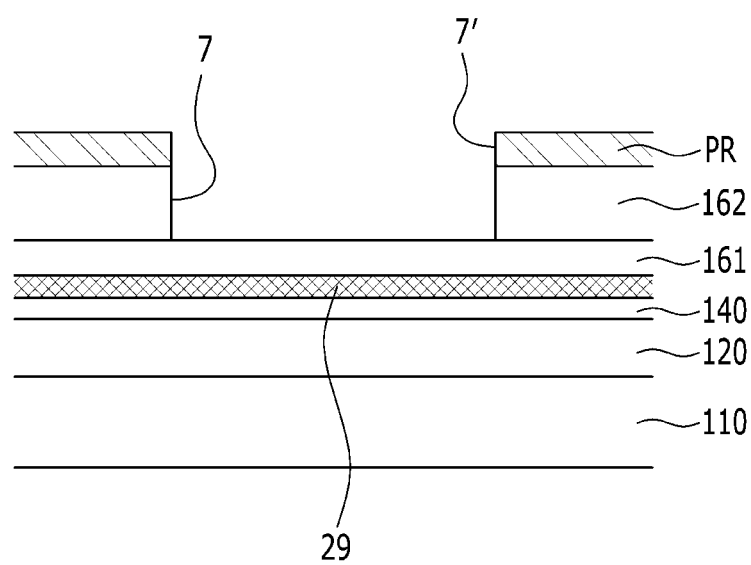
FIG. 24 is a view showing a step after that of FIG. 21.

FIG. 19 is a cross-sectional view showing a step of etching a second interlayer insulating layer by using a half-tone mask taken along a position corresponding to the line XVI-XVI of FIG. 14, FIG. 20 is a cross-sectional view showing a step of etching a second interlayer insulating layer by using a half-tone mask taken along a position corresponding to the line XVII-XVII of FIG. 14, FIG. 21 is a cross-sectional view showing a step of etching a second interlayer insulating layer by using a half-tone mask taken along a position corresponding to the line XVIII-XVIII of FIG. 15, FIG. 22 is a view showing a step next to FIG. 19, FIG. 23 is a view showing a step after that of FIG. 20, and FIG. 24 is a view showing a step after that of FIG. 21.

As shown in FIG. 19, FIG. 20, and FIG. 21, a photosensitive film PR is formed on the second interlayer insulating layer 162. Also, by exposing the photosensitive film PR by using the third mask as the half tone mask, regions 62', 63', 64', 66', and 67' corresponding to the contact holes 62, 63, 64, 66, 67, and 68 among the photosensitive film PR expose the second interlayer insulating layer 162, and regions 6' and 7' respectively corresponding to the storage opening 6 and the first sealant opening 7 among the photosensitive film PR do not expose the second interlayer insulating layer 162. Further, the exposed second interlayer insulating layer 162 is etched by using the photosensitive film PR as the etching mask to expose the first interlayer insulating layer 161 corresponding to the contact holes 61, 62, 63, 64, 65, 66, 67, and 68.

Next, as shown in FIG. 22, FIG. 23, and FIG. 24, by entirely decreasing the thickness of the photosensitive film PR by performing an ashing process, the regions 6' and 7' respectively corresponding to the storage opening 6 and the first sealant opening 7 among the photosensitive film PR expose the second interlayer insulating layer 162. In addition, the exposed second interlayer insulating layer 162 is etched by using the photosensitive film PR as the etching mask to form the storage opening 6 and the first sealant opening 7 in the second interlayer insulating layer 162. Among the photosensitive film PR, the first interlayer insulating layer 161 and the gate insulating layer 140 of the regions 62', 63', 64', 66', and 67' corresponding to the contact holes 62, 63, 64, 66, 67, and 68 are simultaneously etched such that the semiconductor 130 is exposed. Also, the remaining photosensitive film PR is removed. Accordingly, as shown in FIG. 14, FIG. 15, FIG. 16, FIG. 17, and FIG. 18, the contact holes 62, 63, 64, 66, 67, and 68 passing through the gate insulating layer 140, the first interlayer insulating layer 161, and the second interlayer insulating layer 162 are completed.

As such, by simultaneously forming the contact holes 62, 63, 64, 66, 67, and 68, the storage opening 6, and the first sealant opening 7 by using one third mask with different depths, the manufacturing cost may be reduced.

Next, as shown in FIG. 2, FIG. 3, FIG. 4, FIG. 5, FIG. 6, FIG. 7, and FIG. 8, the data metal layer is formed on the second interlayer insulating layer 162. The data metal layer may be formed as a multilayer where a metal layer including any one of copper, a copper alloy, aluminum, and an aluminum alloy, and a metal layer including any one of molybdenum and a molybdenum alloy, are laminated. For example, the data metal layer may be formed as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

In addition, the data metal layer is patterned by the photolithography process using a fourth mask. The data line 171, the first driving voltage line 172a including the second storage electrode 178, the driving connecting member 174, the initialization connecting member 175, and the pixel connecting member 179 are formed on the second interlayer insulating layer 162 of the display area DA, and as shown in FIG. 5 and FIG. 8, the etching preventing member 79 is formed in the first sealant opening 7 of the second interlayer insulating layer 162 of the peripheral area PA. As such, by forming the etching preventing member 79 overlapping the fan-out line 29, the damage to the first interlayer insulating layer 161 due to the etchant inflowed through the first sealant opening 7 in the etching process of the data metal line may be prevented.

Also, by forming the second storage electrode 178 with the same material as the first driving voltage line 172a and the data line 171, it is not necessary to form the second storage electrode as the separate layer, thereby reducing a number of masks used for the manufacturing.

Also, the passivation layer 180 covering the data metal line (171, 172a, 174, 175, 178, 179, and 79) is formed on the second interlayer insulating layer 162. The passivation layer 180 includes the organic material such as a polyacrylate resin or a polyimide resin. Also, the contact holes 81 and 82 are formed in the passivation layer 180 of the display area DA and the second sealant opening 8 is formed in the passivation layer 180 of the peripheral area PA by the photolithography process using a fifth mask. Accordingly, the sealant opening 9 made of the first sealant opening 7 and the second sealant opening 8 is completed.

Further, a pixel electrode layer is formed on the passivation layer 180, and is patterned by the photolithography process using a sixth mask. Accordingly, the pixel electrode 191 connected to the pixel connecting member 179 through the contact hole 81 and the second driving voltage line 172b connected to the first driving voltage line 172a through the contact hole 82 are formed on the passivation layer 180.

In this case, since the sealant opening 9 is filled with the etching preventing member 79, although the etchant for patterning the pixel electrode layer inflows to the sealant opening 9, the first interlayer insulating layer 161 is not damaged by the etchant. Accordingly, the etchant is prevented from being inflowed into the fan-out line 29 positioned under the first interlayer insulating layer 161, thereby preventing the damage to the fan-out line 29.

A pixel definition layer 350 covering the pixel electrode 191 and the second driving voltage line 172b is formed on the passivation layer 180, and a pixel opening 351 exposing the part of the pixel electrode 191 is formed in the pixel definition layer 350 by using a seventh mask. Also, an organic emission layer 370 is formed on the pixel electrode 191 exposed through the pixel opening 351 of the pixel definition layer 350. A common electrode 270 is formed on the organic emission layer 370 to complete the organic light emitting diode OLD. The common electrode 270 is formed throughout the entire region including the pixel definition layer 350, thereby eliminating a separate mask.

Also, the sealant 300 is formed on the passivation layer 180 of the peripheral area PA. The sealant 300 fills the sealant opening 9 formed in the second interlayer insulating layer 162 made of the organic material and the passivation layer 180. Accordingly, the sealant 300 is strongly adhered to the second interlayer insulating layer 162 and the passivation layer 180 by the sealant opening 9.

In one embodiment, the etching preventing member may be singular etching preventing member respectively overlapping the plurality of fan-out lines, however the etching preventing member may be an integral type of etching preventing member simultaneously overlapping the plurality of fan-out lines as another embodiment.

Next, the organic light emitting diode display according to another embodiment is described with reference to FIG. 25.

Figure 25:
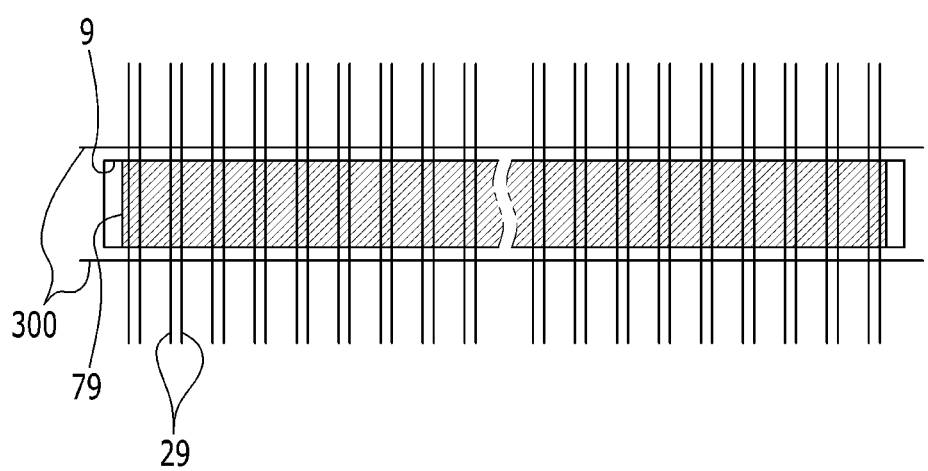
FIG. 25 is a layout view of a fan-out line and an etching preventing member formed in a peripheral area of an organic light emitting diode display according to another embodiment.

FIG. 25 is a layout view of a fan-out line 29 and an etching preventing member 79 formed in a peripheral area of an organic light emitting diode display according to another embodiment.

The embodiment shown in FIG. 25 is substantially the same as the embodiment shown in FIG. 2, FIG. 3, FIG. 4, FIG. 5, FIG. 6, FIG. 7, and FIG. 8, except for the formation of the etching preventing member such that the repeated description is omitted.

As shown in FIG. 25, in the organic light emitting diode display, the etching preventing member 79 covering all of the plurality of fan-out lines 29 is formed on the plurality of fan-out lines 29. The etching preventing member 79 is the integral type of etching preventing member overlapping all of the plurality of fan-out lines 29. Accordingly, the etching preventing member 79 overlaps the fan-out lines 29 and is simultaneously disposed between the adjacent fan-out lines.

The etching preventing member 79 is positioned at the sealant opening 9 formed in both the second interlayer insulating layer 162 and the passivation layer 180. The sealant opening 9 is filled with the sealant 300.

As such, since the integral type of etching preventing member 79 covers the fan-out lines 29 and the surroundings thereof, damage to the fan-out lines 29 by the etchant inflowed through the sealant opening 9 in the etching process of the pixel electrode may be further effectively prevented.

While this disclosure has been described in connection with certain embodiments, it is to be understood that the disclosure is not limited to the disclosed embodiments, but, on the contrary, is intended to cover various modifications and equivalent arrangements included within the spirit and scope of the appended claims.

<Description of symbols>

| | |
|---|---|
| 7: first sealant opening | 8: second sealant opening |
| 29: fan-out line | 79: etching preventing member |
| 131a: driving channel | 132b: switching channel |
| 140: gate insulating layer | 151: scan line |
| 152: previous scan line | 153: light emission control line |
| 155a: driving gate electrode | 155b: switching gate electrode |
| 161: first interlayer insulating layer | 162: second interlayer insulating layer |
| 171: data line | 172: driving voltage line |
| 174: driving connecting member | 175: initialization connecting member |
| 179: pixel connecting member | 180: passivation layer |
| 191: pixel electrode | 270: common electrode |
| 300: sealant | 350: pixel definition layer |
| 370: organic emission layer | |

What is claimed is:

1. An organic light emitting diode display, comprising:
a substrate including a display area displaying an image and a peripheral area enclosing the display area;
a plurality of signal lines formed in the display area;
a plurality of pixels connected to the plurality of signal lines;
a plurality of fan-out lines formed in the peripheral area and connected to the plurality of pixels;
a first interlayer insulating layer covering the plurality of fan-out lines;
a second interlayer insulating layer covering the first interlayer insulating layer and including a first sealant opening exposing a portion of the first interlayer insulating layer; and
an etching preventing member positioned in the first sealant opening and overlapping the plurality of fan-out lines in plan view.

2. The organic light emitting diode display of claim 1, further comprising:
a passivation layer formed on the second interlayer insulating layer and including a second sealant opening having the same pattern as the first sealant opening; and
a sealant in the peripheral area and crossing the plurality of fan-out lines,
wherein the sealant fills the first sealant opening and the second sealant opening.

3. The organic light emitting diode display of claim 2, wherein
each of the plurality of signal lines includes a scan line formed on the substrate and transmitting a scan signal, and a data line and a driving voltage line crossing the scan line and respectively transmitting a data voltage and a driving voltage, and
each of the plurality of pixels includes:
a switching transistor connected to the scan line and the data line,
a driving transistor connected to the switching transistor and including a driving gate electrode, a second storage electrode overlapping a first storage electrode of the driving gate electrode and extended from the driving voltage line, and an organic light emitting diode electrically connected to the driving transistor.

4. The organic light emitting diode display of claim 3, wherein each of the plurality of fan-out lines is formed on the same layer as the scan line, and the etching preventing member is formed on the same layer as the data line.

5. The organic light emitting diode display of claim 3, wherein the first interlayer insulating layer covers the scan line, and the data line is formed on the second interlayer insulating layer.

6. The organic light emitting diode display of claim 3, wherein the sealant is positioned on the etching preventing member.

7. The organic light emitting diode display of claim 3, wherein the driving voltage line includes a first driving voltage line parallel to the data line and a second driving voltage line parallel to the data line, wherein the first driving voltage line is formed on the same layer as the data line, and the second driving voltage line is formed on the same layer as the scan line.

8. The organic light emitting diode display of claim 7, wherein the second storage electrode is formed on the first interlayer insulating layer, and the first driving voltage line and the data line are formed on the second interlayer insulating layer.

9. The organic light emitting diode display of claim 2, wherein the first interlayer insulating layer includes an inorganic material, and the second interlayer insulating layer and the passivation layer include an organic material.

10. The organic light emitting diode display of claim 2, wherein the etching preventing member overlaps each of the plurality of fan-out lines.

11. The organic light emitting diode display of claim 2, wherein the etching preventing member overlaps the plurality of fan-out lines together.

12. The organic light emitting diode display of claim 1, further comprising a semiconductor formed on the substrate and including a switching channel of the switching transistor and a driving channel of the driving transistor separated from each other, wherein the driving channel overlaps the driving gate electrode and the driving channel is curved in plan view.

* * * * *